United States Patent
Wang et al.

(10) Patent No.: US 12,494,360 B2
(45) Date of Patent: *Dec. 9, 2025

(54) APPARATUS AND METHOD FOR CLEANING SEMICONDUCTOR WAFERS

(71) Applicant: ACM RESEARCH (SHANGHAI), INC., Shanghai (CN)

(72) Inventors: Hui Wang, Shanghai (CN); Zhiyou Fang, Shanghai (CN); Jun Wu, Shanghai (CN); Guanzhong Lu, Shanghai (CN); Fuping Chen, Shanghai (CN); Jian Wang, Shanghai (CN); Jun Wang, Shanghai (CN); Deyun Wang, Shanghai (CN)

(73) Assignee: ACM Research (Shanghai) Inc., Shanghai (CN)

( * ) Notice: Subject to any disclaimer, the term of this patent is extended or adjusted under 35 U.S.C. 154(b) by 8 days.

This patent is subject to a terminal disclaimer.

(21) Appl. No.: 18/762,434

(22) Filed: Jul. 2, 2024

(65) Prior Publication Data

US 2024/0355614 A1 Oct. 24, 2024

Related U.S. Application Data

(63) Continuation of application No. 16/972,936, filed as application No. PCT/CN2018/090227 on Jun. 7, 2018, now Pat. No. 12,068,149.

(51) Int. Cl.
*H01L 21/02* (2006.01)
*H01L 21/67* (2006.01)
*H01L 21/677* (2006.01)

(52) U.S. Cl.
CPC .... *H01L 21/02052* (2013.01); *H01L 21/6715* (2013.01); *H01L 21/67253* (2013.01); *H01L 21/67742* (2013.01); *H01L 21/67781* (2013.01)

(58) Field of Classification Search
CPC ......... H01L 21/00–86; H01L 21/68707; H01L 21/67793; H01L 21/67718; H01L 21/68–682; H01L 21/677–67796
See application file for complete search history.

(56) References Cited

U.S. PATENT DOCUMENTS

| | | | |
|---|---|---|---|
| 2006/0137726 A1* | 6/2006 | Sano | H01L 21/67028 118/696 |
| 2015/0332940 A1* | 11/2015 | Wang | H01L 21/67781 134/25.1 |
| 2018/0090358 A1* | 3/2018 | Miyamoto | H01L 21/67288 |

* cited by examiner

*Primary Examiner* — Kaj K Olsen
*Assistant Examiner* — Richard Z. Zhang
(74) *Attorney, Agent, or Firm* — Osha Bergman Watanabe & Burton LLP

(57) ABSTRACT

An apparatus for cleaning semiconductor wafers includes a plurality of load ports; at least one first tank, containing cleaning chemical, configured to implement batch cleaning process; one or more second tanks, containing cleaning liquid, configured to implement batch cleaning process; and one or more single wafer cleaning modules. The apparatus further includes: a first turnover device, configured to rotate the one or more wafers from horizontal plane to vertical plane so that the one or more wafers can be vertically transferred to the at least one first tank; and a second turnover device, configured to rotate the one or more wafers from vertical plane to horizontal plane so that the one or more wafers can be horizontally transferred to the one or more single wafer cleaning modules.

19 Claims, 33 Drawing Sheets

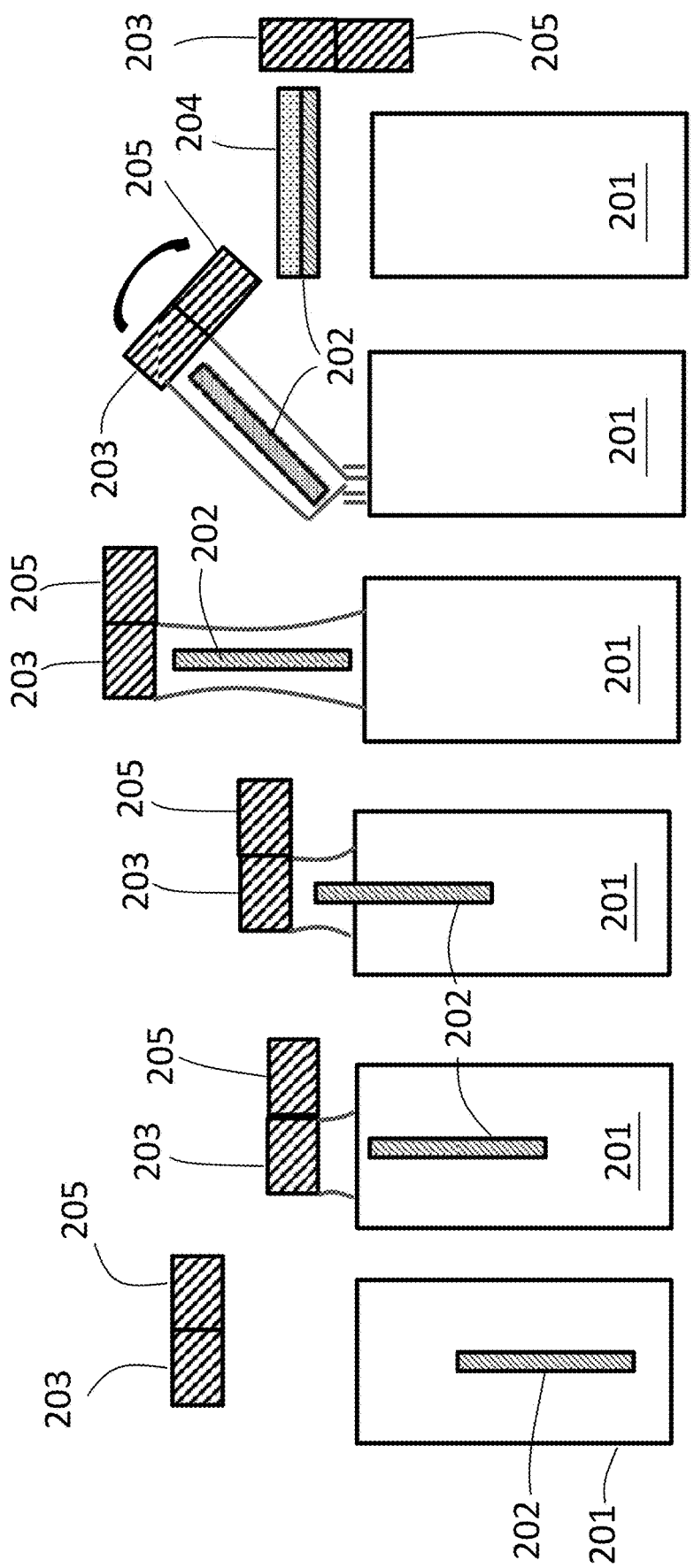

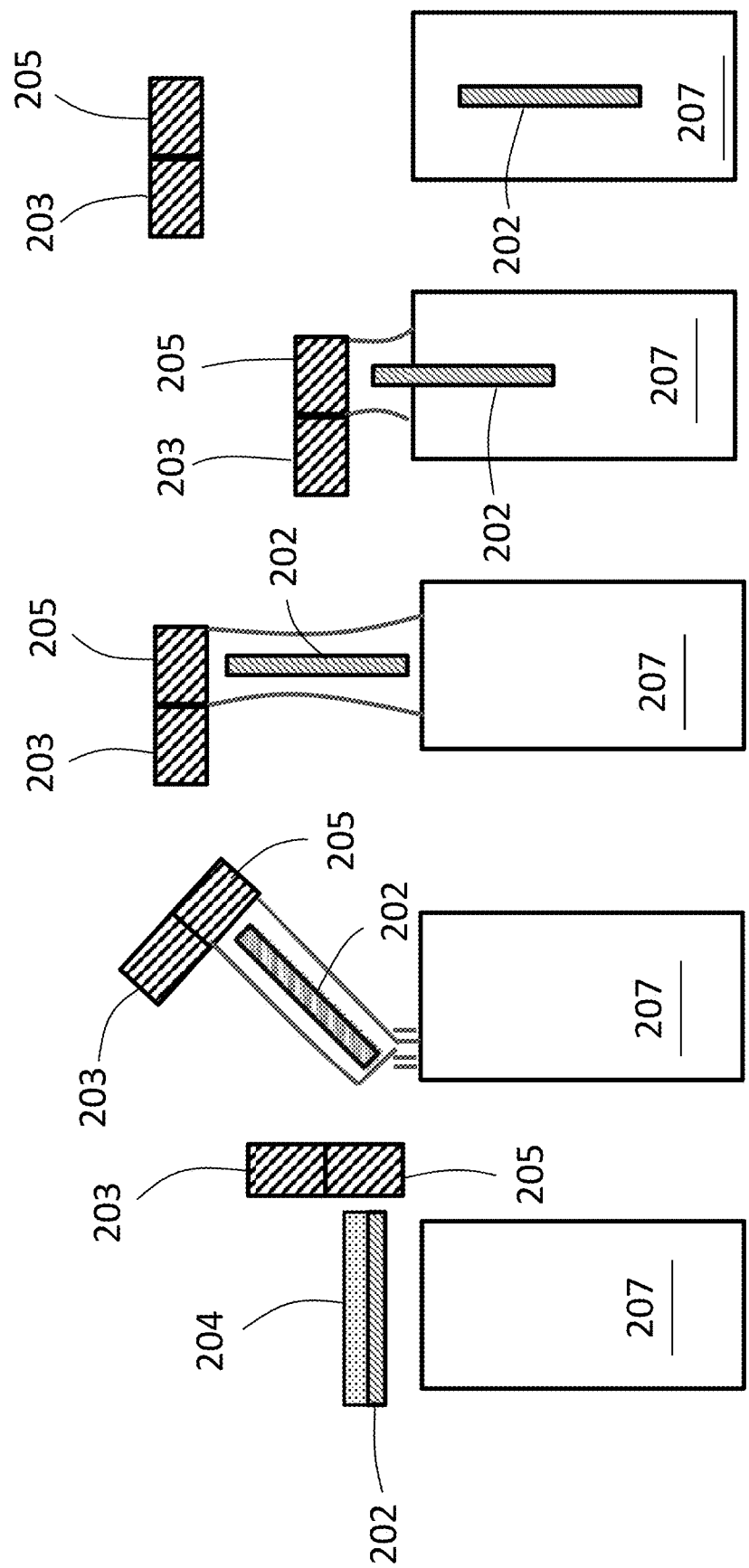

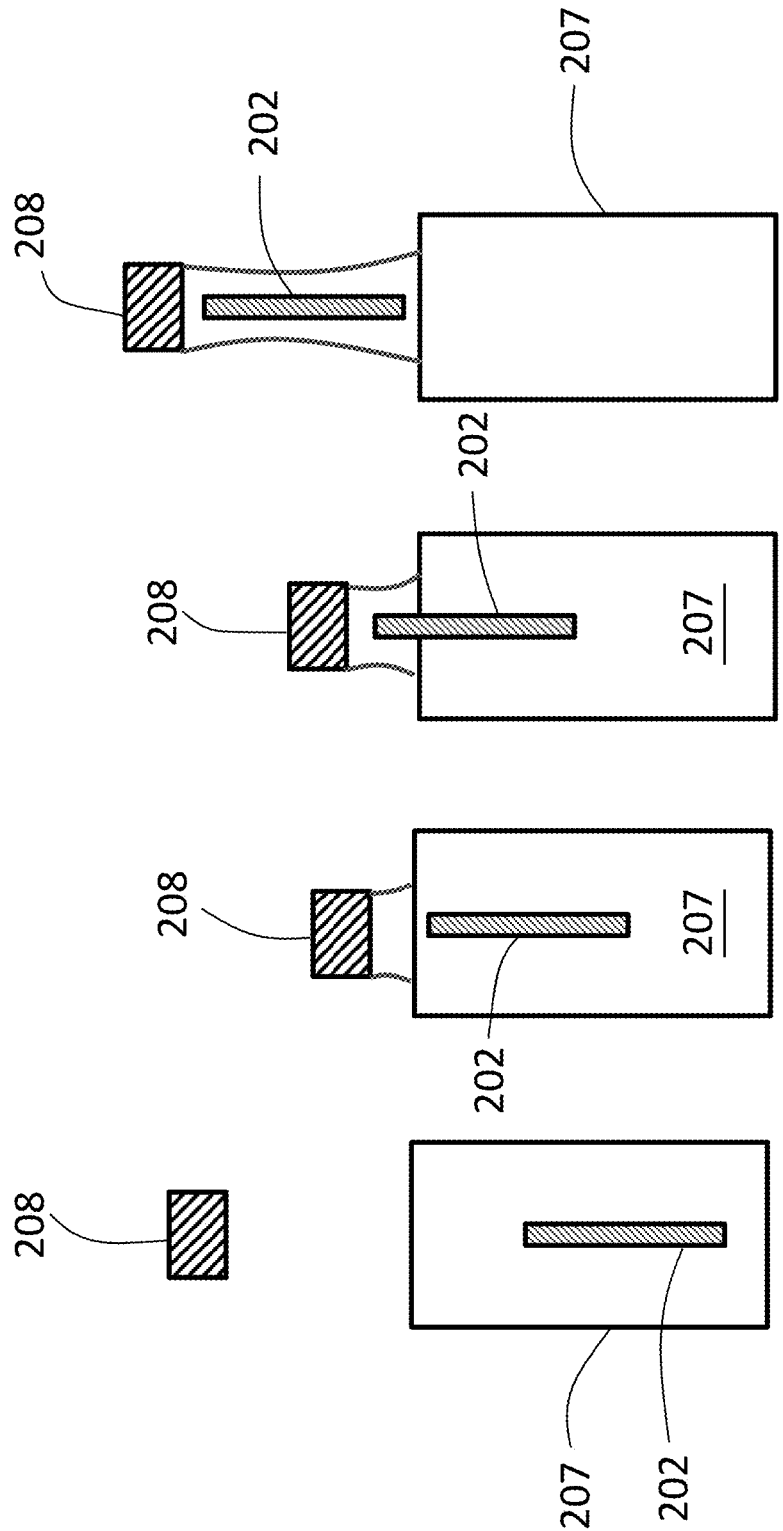

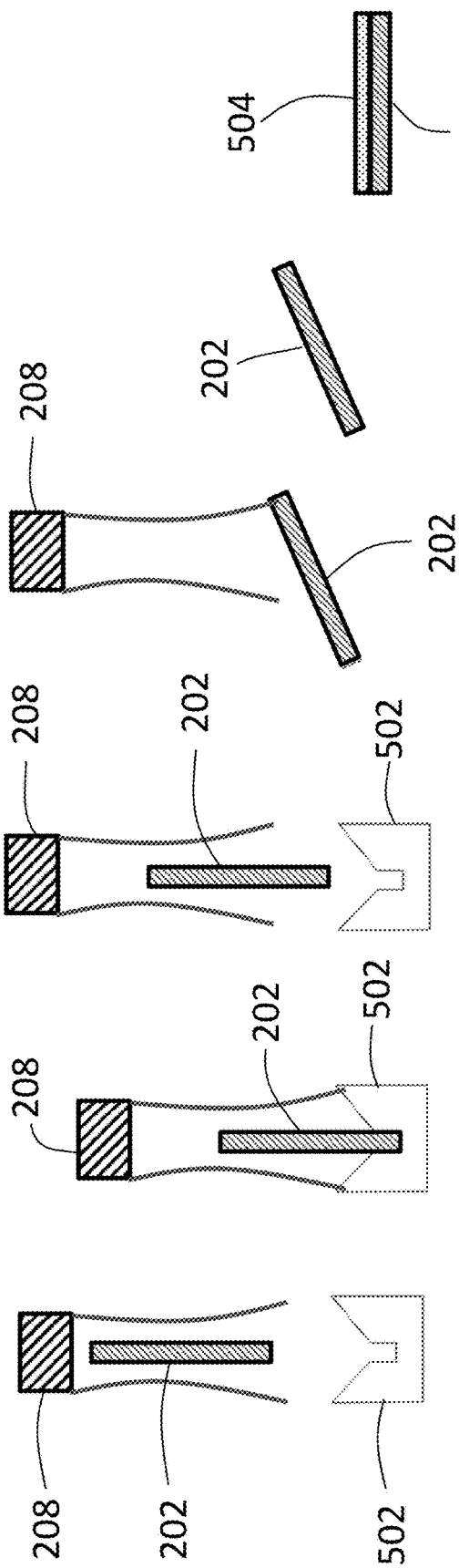
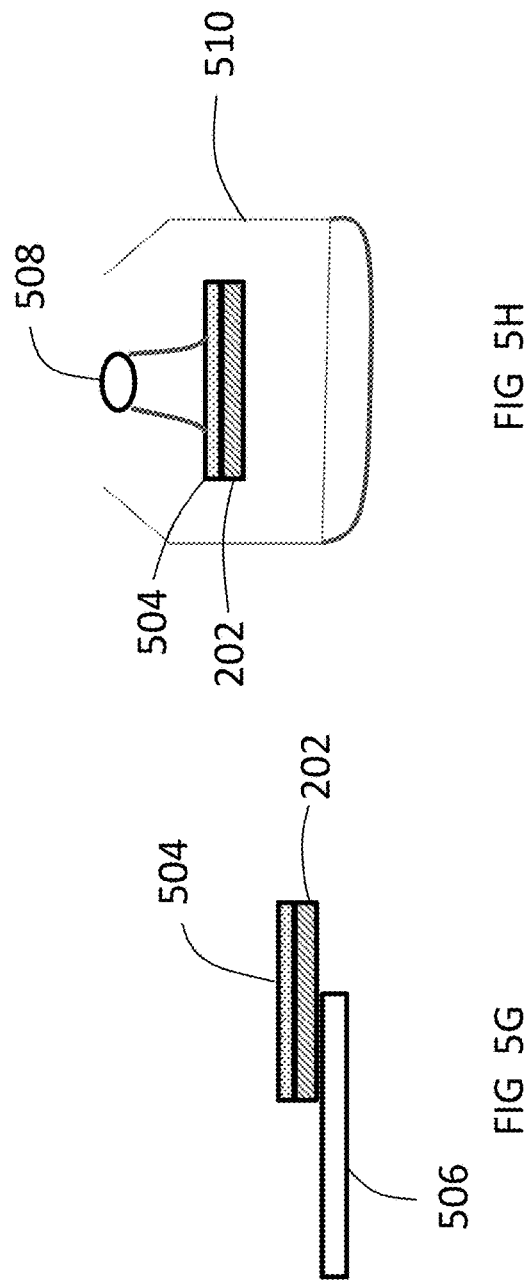

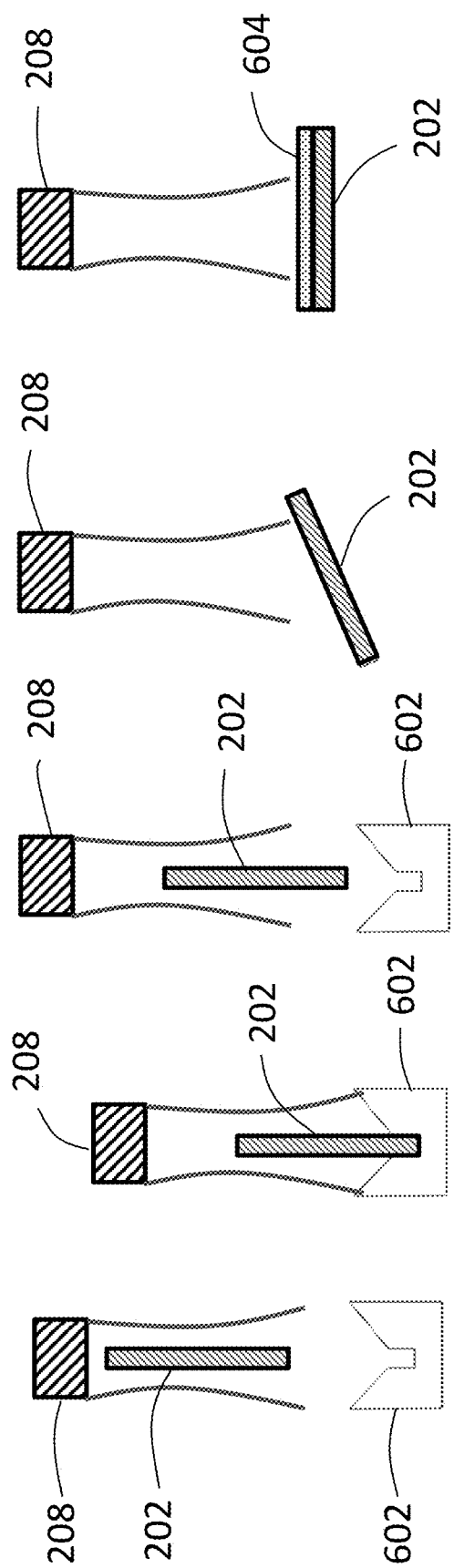

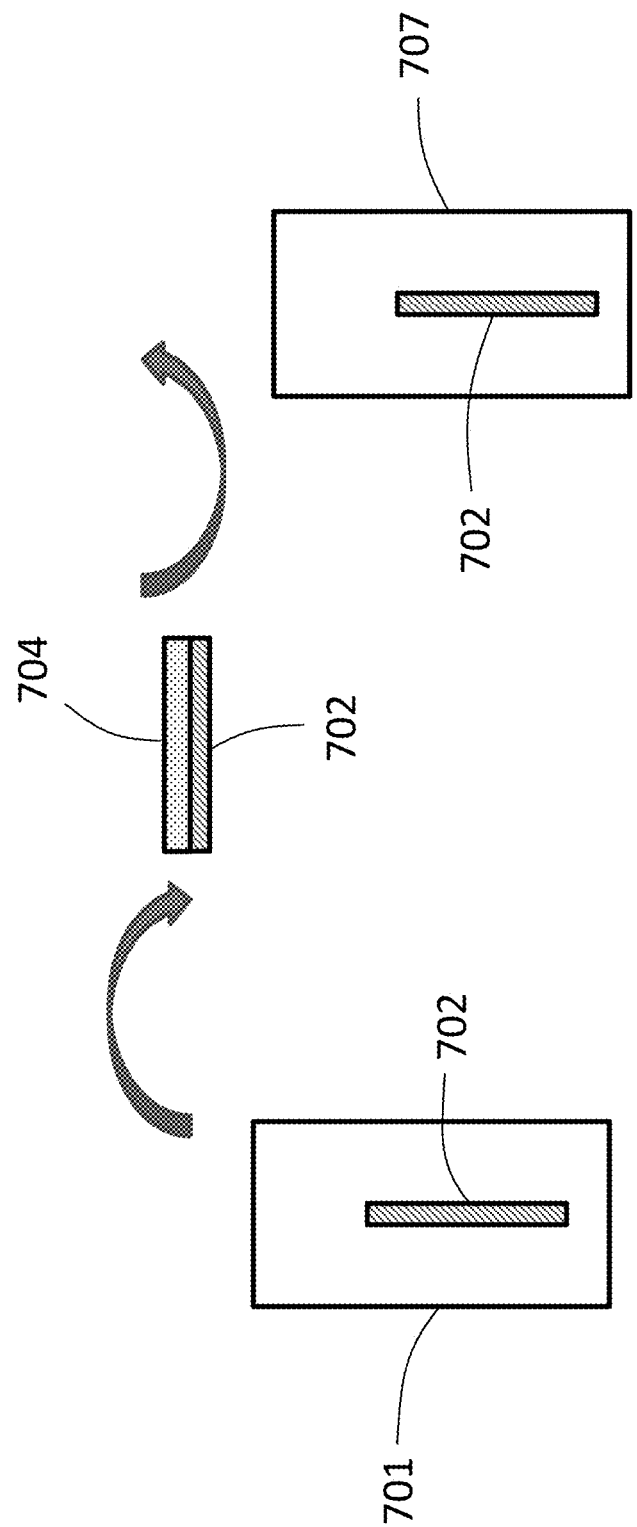

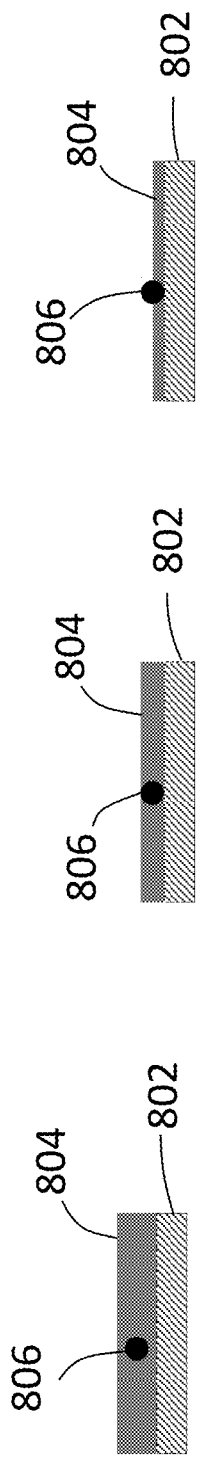

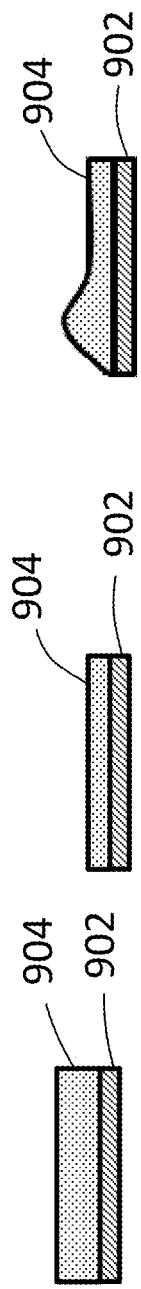

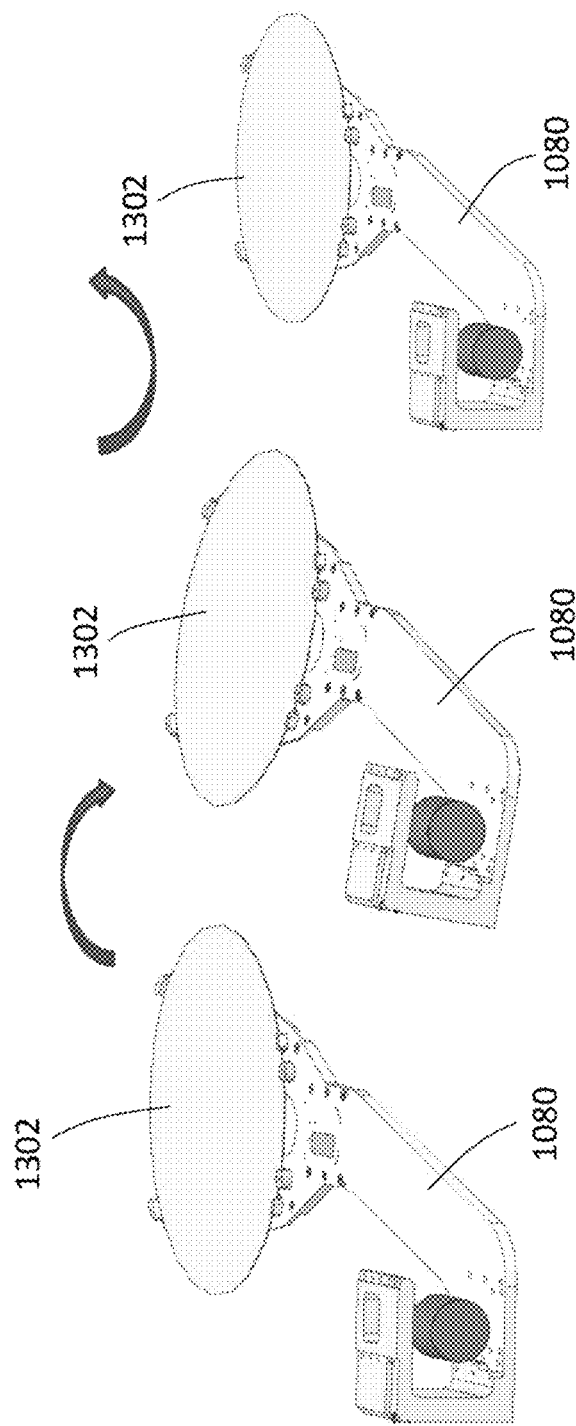

APPARATUS AND METHOD FOR CLEANING SEMICONDUCTOR WAFERS

PRIORITY CLAIM

This application is a divisional application of U.S. application Ser. No. 16/972,936, entitled "Apparatus and method for cleaning semiconductor wafers," which is a national stage filing of international application No. PCT/CN2018/090227, filed on Jun. 7, 2018. Each of these applications are hereby incorporated by reference in their entirety as though fully and completely set forth herein.

BACKGROUND OF THE INVENTION

1. Field of the Invention

The present invention relates generally to semiconductor manufacturing, and more specifically, to apparatuses and methods for cleaning semiconductor wafers.

2. The Related Art

In the manufacture of integrated circuits, a wet cleaning process is essential for obtaining high quality integrated circuits. After a dry etching process, a wafer needs to be cleaned to remove residual photoresist, organics produced during the dry etching process, and film material attached on a surface of the wafer. The main chemical solution for cleaning the wafer includes, for example SC1, BOE and SPM which is a mixture of $H_2SO_4$ and $H_2O_2$. Thereinto, the temperature of SPM may be higher than 80° C. and the high temperature SPM can be used for removing the residual photoresist and organics. Generally, there is two ways to clean the wafer. One is batch cleaning and another is single wafer cleaning, both of which will be comparatively described hereinafter.

The batch cleaning is capable of cleaning a plurality of wafers every time. An apparatus for batch cleaning includes mechanical transmission devices and a plurality of cleaning tanks. A plurality of wafers can be cleaned in one of the cleaning tanks simultaneously, so the efficiency of batch cleaning is high. Moreover, because the chemical solution in the cleaning tanks is circulated, therefore, the chemical solution can be reused and the cost of batch cleaning is reduced, especially for high temperature chemical solution, like 120° C. SPM. Since the high temperature SPM is expensive, so the cleaning cost can be reduced by using the batch cleaning. However, with the line width of integrated circuits shrinking continuously, the disadvantages of the batch cleaning are exposed visibly. During the batch cleaning process, the wafers are put in the cleaning tanks vertically, which easily causes cross contamination among wafers. Specially, if one of the wafers in one of the cleaning tanks has metal or organic contaminants, all the wafers cleaned in the same cleaning tank are contaminated. After cleaned, the wafers are taken out of the cleaning tanks vertically. At this time, if the chemical solution in the cleaning tanks has some tiny organic contaminants or particles, the tiny organic contaminants or particles will adhere to the surfaces of the wafers along with the chemical solution. Once the wafers are dried, the tiny organic contaminants or particles on the wafers are very hard to remove.

The single wafer cleaning can only clean a piece of wafer every time. An apparatus for single wafer cleaning includes mechanical transmission devices and a plurality of independent single wafer cleaning modules. The cleaning and drying processes of one wafer are done in one single wafer cleaning module. After cleaning a piece of wafer, the chemical solution in the single wafer cleaning module is drained and new chemical solution is supplied to the single wafer cleaning module to clean another piece of wafer, effectively avoiding cross contaminant. The single wafer cleaning can effectively remove particles and film material and avoid metal ions pollution. However, the single wafer cleaning has a limitation in use of high temperature chemical solution, such as SPM which temperature is higher than 130° C., because the high temperature chemical solution is hard to recycle, so that requires large quantity of SPM. Moreover, the single wafer cleaning is fitter for cleaning the front side of the wafer and has some difficulty and challenge to clean the back side of the wafer. In some cases, the single wafer cleaning takes a long time while cleaning the wafer and the throughput is low.

Both the batch cleaning and the single wafer cleaning have their own advantages and disadvantages. Only adopting the batch cleaning or the single wafer cleaning cannot achieve the best cleaning effect and also cannot meet the needs of modern process. Therefore, an idea which combines the batch cleaning and the single wafer cleaning has been put forward. However, a big challenge of combining the batch cleaning and the single wafer cleaning is that it is very difficult to control particles and contaminants in the bench cleaning liquid to not be attached to the wafer when the wafer is taken out from the liquid in the cleaning tanks till the wafer is transferred to the single wafer cleaning module. During this period, if the particles and contaminants are attached to the surface of the wafer, it is very hard to remove those particles and contaminants in the single wafer cleaning modules.

SUMMARY

Disclosed herein are methods and apparatuses for cleaning semiconductor wafers.

According to an embodiment of the present invention, a method for cleaning semiconductor wafers is provided. The method comprises transferring one or more wafers to at least one first tank containing cleaning chemical, one or more second tanks containing cleaning liquid successively for implementing batch cleaning process, and taking the one or more wafers out of the cleaning liquid in the one or more second tanks and transferring the one or more wafers to one or more single wafer cleaning modules for implementing single wafer cleaning and drying processes; wherein control and keep a certain thickness of liquid film on the one or more wafers from the moment of the one or more wafers out of the cleaning chemical in the at least one first tank till the one or more wafers are immersed in the cleaning liquid of the one or more second tanks, and/or from the moment of the one or more wafers out of the cleaning liquid in the one or more second tanks till the one or more wafers are transferred to the one or more single wafer cleaning modules.

According to another embodiment of the present invention, a method for cleaning semiconductor wafers is provided. The method comprises transferring one or more wafers to at least one tank filled with cleaning solution for implementing batch cleaning process, and taking the one or more wafers out of the at least one tank and transferring the one or more wafers to one or more single wafer cleaning modules for implementing single wafer cleaning and drying processes; wherein control and keep a certain thickness of liquid film on the one or more wafers from the moment of the one or more wafers out of the cleaning solution in the at least one tank till the one or more wafers are transferred to the one or more single wafer cleaning modules.

According to an embodiment of the present invention, an apparatus for cleaning semiconductor wafers is provided. The apparatus comprises at least one first tank, containing cleaning chemical, configured to implement batch cleaning process; one or more second tanks, containing cleaning liquid, configured to implement batch cleaning process; one or more single wafer cleaning modules, configured to implement single wafer cleaning and drying processes; a plurality of robots, configured to transfer one or more wafers; a controller, configured to control the plurality of robots to transfer one or more wafers to the at least one first tank and the one or more second tanks successively, and then to the one or more single wafer cleaning modules; wherein the controller is configured to keep a certain thickness of liquid film on the one or more wafers from the moment of the one or more wafers out of the cleaning chemical in the at least one first tank till the one or more wafers are immersed in the cleaning liquid of the one or more second tanks, and/or from the moment of the one or more wafers out of the cleaning liquid in the one or more second tanks till the one or more wafers are transferred to the one or more single wafer cleaning modules.

According to another embodiment of the present invention, an apparatus for cleaning semiconductor wafers is provided. The apparatus comprises a plurality of load ports; at least one first tank, containing cleaning chemical, configured to implement batch cleaning process; one or more second tanks, containing cleaning liquid, configured to implement batch cleaning process; one or more single wafer cleaning modules, configured to implement single wafer cleaning and drying processes; wherein the plurality of load ports is transversely arranged, the at least one first tank and the one or more second tanks are lengthways arranged at one side, and the one or more single wafer cleaning modules are lengthways arranged at the other side and opposing the at least one first tank and the one or more second tanks.

According to another embodiment of the present invention, an apparatus for cleaning semiconductor wafers is provided. The apparatus comprises at least one tank, containing cleaning solution, configured to implement batch cleaning process; one or more single wafer cleaning modules, configured to implement single wafer cleaning and drying processes; one or more robots, configured to transfer one or more wafers to the at least one tank and the one or more single wafer cleaning modules; a controller, configured to control the one or more robots; wherein the controller is configured to keep a certain thickness of liquid film on the one or more wafers from the moment of the one or more wafers out of the cleaning solution in the at least one tank till the one or more wafers are transferred to the one or more single wafer cleaning modules.

BRIEF DESCRIPTION OF THE DRAWINGS

The above and other objectives, features and advantages of the present invention will become more apparent through more detailed depiction of example embodiments of the present invention in conjunction with the accompanying drawings, wherein in example embodiments of the present invention, same reference numerals usually represent same components.

FIG. 2A to FIG. 2F depict controlling and keeping a thickness of liquid film on a wafer from the moment of the wafer out of the liquid in a first tank till the wafer has been completely taken out of the first tank according to an embodiment of the present invention.

FIG. 3A to FIG. 3E depict controlling and keeping a thickness of liquid film on the wafer from the moment of the wafer rotating above a second tank till the wafer has been completely immersed in the liquid of the second tank according to an embodiment of the present invention.

FIG. 4A to FIG. 4D depict controlling and keeping a thickness of liquid film on the wafer from the moment of the wafer out of the liquid in the second tank till the wafer has been completely taken out of the second tank according to an embodiment of the present invention.

FIG. 5A to FIG. 5H depict controlling and keeping a thickness of liquid film on the wafer from the wafer being transferred to a second turnover device till the wafer is transferred to a single wafer cleaning module and liquid is sprayed on the wafer in the single wafer cleaning module according to an embodiment of the present invention.

FIG. 6A to FIG. 6J depict controlling and keeping a thickness of liquid film on the wafer from the wafer being transferred to a second turnover device till the wafer is transferred to a single wafer cleaning module and liquid is sprayed on the wafer in the single wafer cleaning module according to another embodiment of the present invention.

FIG. 7A to FIG. 7B depict controlling and keeping a thickness of liquid film on the wafer from the wafer being taken out of the first tank till the wafer is put in the second tank according to an embodiment of the present invention.

FIG. 8A depicts when the thickness of liquid film on a wafer is greater than the diameter of particles of interest, the particles of interest may not attach to a surface of the wafer; FIG. 8B and FIG. 8C depict if the thickness of liquid film on a wafer is equal to or less than the diameter of particles of interest, the particles of interest may attach to a surface of the wafer according to the present invention.

FIG. 9A to FIG. 9C depict three modes of liquid film formed on a wafer by controlling the time of inclining the wafer, the angle of inclining the wafer, and acceleration of robot during transferring the wafer.

FIG. 30A to FIG. 30C depict another way of controlling and keeping a thickness of liquid film on a wafer by controlling a robot according to an embodiment of the present invention.

DETAILED DESCRIPTION OF EMBODIMENTS

For the combination of batch cleaning and single wafer cleaning to give full play to the advantages of the batch cleaning and the single wafer cleaning, a huge challenge is how to control and keep particles and contaminants not attaching to the surfaces of wafers all the time from the moment of the wafers out of liquid after the wafers have been implemented batch cleaning till liquid is sprayed on the wafers for implementing single wafer cleaning. During this period, if the particles or contaminants attach on the wafers, it will be difficult to remove them away from the wafers even in single wafer cleaning process, which will adversely impact product yield and quality.

Figure 1B:
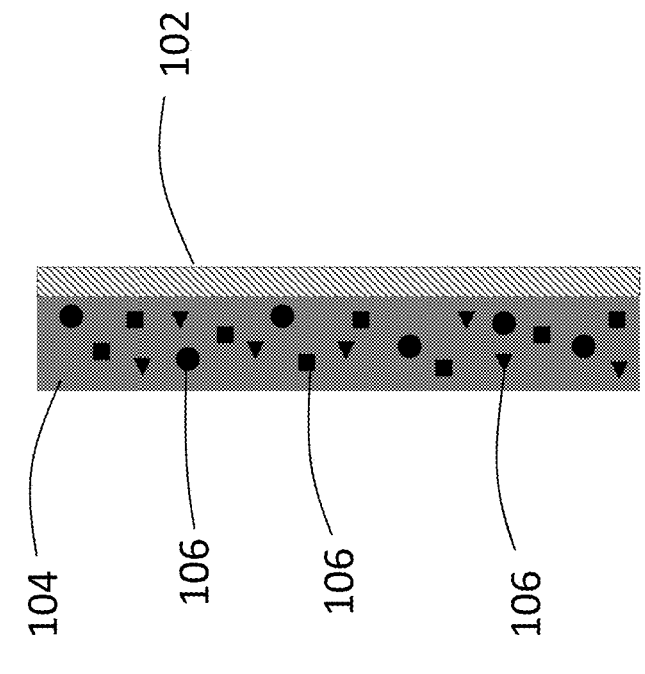
FIG. 1B depicts a thick liquid film makes particles be far from a surface of a wafer.
Figure 1A:
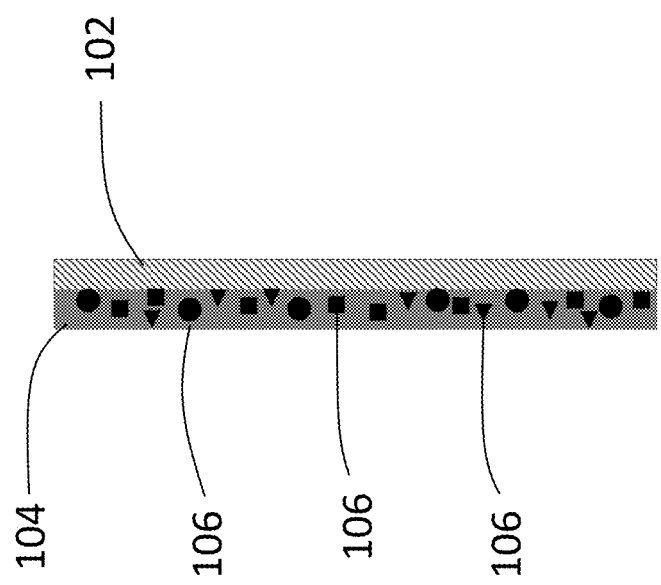
FIG. 1A depicts a thin liquid film may make particles attach to a surface of a wafer.

As shown in FIG. 1A according to the present invention, a thin liquid film 104 is remained on a wafer 102 after the wafer 102 is taken out of liquid. Because the liquid film 104 is too thin, which compels particles 106 to attach on the wafer 102 and then the particles 106 are hard to remove in subsequent cleaning steps. In comparison, as shown in FIG. 1B, a thicker liquid film 104 is remained on the wafer 102 after the wafer 102 is taken out of liquid. Because the liquid film 104 is thicker, inducing the particles 106 to be far away from the surface of the wafer 102. Therefore, the possibility of the particles 106 to attach on the wafer 102 is greatly reduced.

In the following FIG. 2 to FIG. 6, wafers transferred from a first tank to a second tank, then to a single wafer cleaning module will be described.

FIG. 2A to FIG. 2F depict an example embodiment of controlling and keeping a thickness of liquid film on a wafer from the moment of the wafer out of the liquid in a first tank till the wafer has been completely taken out of the first tank according to the present invention. As shown in FIG. 2A, after the wafer 202 has been processed in the first tank 201 which contains liquid, such as SPM solution, for implementing batch cleaning, a liquid providing device is moved to the position above the first tank 201. The liquid providing device has a first nozzle 203 and a second nozzle 205. Then the wafer 202 is picked up in the first tank 201. Before the wafer 202 is coming out of the liquid in the first tank 201, the first nozzle 203 is turned on to spray liquid which is the same liquid as in the first tank 201, such as SPM solution, as shown in FIG. 2B. Because the first nozzle 203 has been turned on to spray liquid, therefore, from the moment of the wafer 202 out of the liquid in the first tank 201, the first nozzle 203 sprays liquid on the wafer 202 to keep a thickness of liquid film on the wafer 202, as shown in FIG. 2C. Because the liquid film on the wafer 202 will become thin from the moment of the wafer 202 coming out of the liquid in the first tank 201, so the first nozzle 203 is configured to spray liquid on the wafer 202 from the moment of the wafer 202 coming out of the liquid in the first tank 201 to keep a thickness of liquid film on the wafer 202. Here, the first nozzle 203 sprays liquid on the wafer 202 can be delayed to after the wafer 202 partly or fully out of the liquid in the first tank 201, as long as the thickness of liquid film on the wafer 202 is above certain value, which will be defined in FIGS. 8A to 8C. The first nozzle 203 continues spraying liquid on the wafer 202 and the wafer 202 has been completely taken out of the first tank 201, as shown in FIG. 2D. Then the wafer 202 is rotated from vertical plane to inclined plane and the liquid providing device is also rotated. The first nozzle 203 continues spraying liquid on the wafer 202, as shown in FIG. 2E. The wafer 202 is rotated from inclined plane to horizontal plane and the liquid providing device is also rotated. After the wafer 202 is rotated to horizontal plane, the first nozzle 203 is turned off to stop spraying liquid on the wafer 202. A thickness of liquid film 204 is formed on the wafer 202, as shown in FIG. 2F. The process of the wafer 202 being rotated from vertical plane to horizontal plane can be a continuous process with a certain rotation speed. The faster the rotation speed is, the thicker the liquid film 204 on the wafer 202. However, the maximum thickness of liquid film on the wafer is determined by surface tension of liquid film on the wafer. Optionally, the wafer 202 is rotated to inclined plane and there is a pause before the wafer 202 is rotated to horizontal plane, in order to control the thickness of liquid film 204 on the wafer 202. The longer the pause time is, the thinner the liquid film 204 on the wafer 202. It is better to keep an appropriate thickness of liquid film on the wafer 202 due to reason to be explained in FIGS. 9A to 9C.

With reference to FIG. 3A to FIG. 3E, the wafer 202 with a thickness of liquid film 204 thereon is horizontally transferred to the position above a second tank 207 which contains liquid, such as deionized water, for implementing batch cleaning, and the liquid providing device is also moved to the position above the second tank 207, as shown in FIG. 3A. Then the wafer 202 is rotated from horizontal plane to inclined plane and finally to vertical plane. This rotation process can be a continuous process. The second nozzle 205 is turned on to spray liquid which type is the same as the liquid in the second tank 207, such as deionized water, onto the wafer 202 from the moment of the wafer 202 rotating, as shown in FIG. 3B and FIG. 3C in order to maintain a certain thickness of liquid on the wafer. The second nozzle 205 continues spraying liquid on the wafer 202 and the wafer 202 is put in the second tank 207, as shown in FIG. 3D. After the wafer 202 has been completely immersed into the liquid of the second tank 207, the second nozzle 205 is turned off to stop spraying liquid, as shown in FIG. 3E. In another embodiment, after the wafer 202 with a thickness of liquid film 204 thereon is horizontally transferred to the position above the second tank 207, the wafer 202 is rotated from horizontal plane to vertical plane and then the wafer 202 is put in the second tank 207 without turning on the second nozzle 205.

With reference to FIGS. 4A-4D, after the wafer 202 has been processed in the second tank 207, a third nozzle 208 is moved to the position above the second tank 207, as shown in FIG. 4A. Then the wafer 202 is picked up in the second tank 207. Before the wafer 202 is coming out of the liquid in the second tank 207, the third nozzle 208 is turned on to spray liquid, such as deionized water, as shown in FIG. 4B. Because the third nozzle 208 has been turned on to spray liquid, therefore, from the moment of the wafer 202 out of the liquid in the second tank 207, the third nozzle 208 sprays liquid on the wafer 202 to keep a thickness of liquid film on the wafer 202, as shown in FIG. 4C. Because the liquid film on the wafer 202 will become thin from the moment of the wafer 202 out of the liquid in the second tank 207, so the third nozzle 208 is configured to spray liquid on the wafer 202 from the moment of the wafer 202 coming out of the liquid in the second tank 207 to keep a thickness of liquid film on the wafer 202. The third nozzle 208 continues spraying liquid on the wafer 202 and the wafer 202 has been completely taken out of the second tank 207, as shown in FIG. 4D.

Referring to FIGS. 5A-5H, the wafer 202 is transferred to a support seat 502 of a turnover device and is held by the support seat 502. During this period, the third nozzle 208 continues spraying liquid on the wafer 202, as shown in FIG. 5A and FIG. 5B. Then the support seat 502 descends and the wafer 202 is held by a wafer holder of the turnover device. The support seat 502 continues to descend and separates from the wafer 202. The third nozzle 208 continues spraying liquid on the wafer 202, as shown in FIG. 5C. The turnover device makes the wafer 202 rotate from vertical plane to inclined plane and the third nozzle 208 continues spraying liquid on the wafer 202, as shown in FIG. 5D. Then the third nozzle 208 stops spraying liquid on the wafer 202 and is moved away, as shown in FIG. 5E. The turnover device makes the wafer 202 rotate from inclined plane to horizontal plane and a maximum thickness of liquid film 504 is remained on the wafer 202, as shown in FIG. 5F. In order to control the thickness of liquid film 504 on the wafer 202, the wafer 202 is rotated to the inclined plane and there is a pause before the wafer 202 is rotated to horizontal plane. The thickness of the liquid film 504 on the wafer 202 is determined by the pause time. The longer the pause time, the thinner the liquid film 504 on the wafer 202. A process robot 506 takes the wafer 202 out of the turnover device and transfers the wafer 202 to a single wafer cleaning module 510, as shown in FIG. 5G and FIG. 5H. A certain thickness of liquid film 504 can be remained on the wafer 202 through controlling the transfer acceleration of the process robot 506. The transfer acceleration of the process robot 506 can be controlled to ensure that the thickness of liquid film 504 on the periphery of the wafer 202 is not greater than the maximum thickness of liquid film held by the liquid surface tension. Therefore, the liquid on the wafer 202 will not drop from the periphery of the wafer 202 during the process robot 506 transferring the wafer 202 and a certain thickness of liquid film 504 can be kept on the wafer 202 to reduce the chance of particles in the liquid film 504 to be attached to the surface of wafer 202. A detail elaboration will be done in FIGS. 8A to 8C.

After the wafer 202 is transferred to the single wafer cleaning module 510, a fourth nozzle 508 sprays liquid on the wafer 202 before the wafer 202 is rotated in the single wafer cleaning module 510 so as to keep a thickness of liquid film 504 on the wafer 202. The wafer 202 is implemented single wafer cleaning and drying in the single wafer cleaning module 510.

Referring to FIGS. 6A to 6J, according to another embodiment of the present invention, the wafer 202 is transferred to a support seat 602 of a turnover device and is held by the support seat 602. During this period, the third nozzle 208 continues spraying liquid on the wafer 202, as shown in FIG. 6A and FIG. 6B. Then the support seat 602 descends and the wafer 202 is held by a wafer holder of the turnover device. The support seat 602 continues to descend and separates from the wafer 202. The third nozzle 208 continues spraying liquid on the wafer 202, as shown in FIG. 6C. The turnover device makes the wafer 202 rotate from vertical plane to inclined plane and the third nozzle 208 continues spraying liquid on the wafer 202, as shown in FIG. 6D. The turnover device makes the wafer 202 rotate from inclined plane to horizontal plane and the third nozzle 208 continues spraying liquid on the wafer 202 to form a thickness of liquid film 604 on the wafer 202, as shown in FIG. 6E. The process of the wafer 202 being rotated from vertical plane to horizontal plane can be a continuous process. Then the third nozzle 208 stops spraying liquid on the wafer 202 and is moved away, as shown in FIG. 6F. The turnover device makes the wafer 202 rotate from horizontal plane to inclined plane and there is a pause at inclined plane so as to control the thickness of liquid film 604 on the wafer 202, as shown in FIG. 6G. The control of inclined angle and pause time can make the liquid film 604 neither too thin to cause particles attaching on the wafer 202 nor too thick to cause the liquid on the wafer 202 dropping while transferring the wafer 202. Then the turnover device makes the wafer 202 rotate from inclined plane to horizontal plane, as shown in FIG. 6H. A process robot 606 takes the wafer 202 out of the turnover device and transfers the wafer 202 to a single wafer cleaning module 610, as shown in FIG. 6I and FIG. 6J. A certain thickness of liquid film 604 can be remained on the wafer 202 through controlling the transfer acceleration of the process robot 606. The transfer acceleration of the process robot 606 can be controlled to ensure that the thickness of liquid film 604 on the periphery of the wafer 202 is not greater than the maximum thickness of liquid film being able to be held by the liquid surface tension. Therefore, the liquid on the wafer 202 will not drop from the periphery of the wafer 202 during the process robot 606 transferring the wafer 202 and a certain thickness of liquid film 604 can be kept on the wafer 202 to reduce the chance of particles in the liquid film 604 to be attached to the surface of wafer 202.

After the wafer 202 is transferred to the single wafer cleaning module 610, a fourth nozzle 608 sprays liquid on the wafer 202 before the wafer 202 is rotated in the single wafer cleaning module 610 so as to keep a thickness of liquid film 604 on the wafer 202. The wafer 202 is implemented single wafer cleaning and drying in the single wafer cleaning module 610.

Please refer to FIG. 7A and FIG. 7B, illustrating another embodiment of controlling and keeping a thickness of liquid film on a wafer according to the present invention. As shown in FIG. 7A, after the wafer 702 has been processed in a first tank 701 which contains liquid, such as SPM solution, for implementing batch cleaning, the wafer 702 is taken out of the first tank 701 and is rotated from vertical plane to horizontal plane so that a thickness of liquid film 704 is remained on the wafer 702. Then the wafer 702 with the thickness of liquid film 704 thereon is transferred to a second tank 707 which contains liquid, such as deionized water, for implementing batch cleaning. The wafer 702 is rotated from horizontal plane to vertical plane and is vertically put in the second tank 707 for implementing batch cleaning.

In all above embodiments, although just one piece of wafer, one first tank, one second tank and one single wafer cleaning module are illustrated to describe the mechanism of controlling and keeping a thickness of liquid film on a wafer of the present invention, it should be recognized that a plurality of wafers can be processed and the number of wafers, the number of first tanks, the number of second tanks and the number of single wafer cleaning modules can be determined by different process requirements.

FIGS. 8A to 8C depict relationship between thickness of the liquid film on a wafer and particle size according to the present invention. The thickness of liquid film on a wafer is related to the diameter of the largest particle. For avoiding particles attaching on the wafer, the thickness of liquid film on the wafer must be not less than the diameter of the largest particle. Satisfied with such a relationship, the largest particle will most likely suspend in the liquid film and the chance to attach on the wafer will be reduced. Since the largest particle may suspend in the liquid film, other particles smaller than the largest particle are easier to suspend in the liquid film and the chance of attaching to wafer is further reduced. FIG. 8A illustrates the thickness of liquid film 804 on the wafer 802 is greater than the diameter of the largest particle 806 in the liquid film 804. FIG. 8B illustrates the thickness of liquid film 804 on the wafer 802 is equal to the diameter of the largest particle 806. FIG. 8C illustrates the thickness of liquid film 804 on the wafer 802 is less than the diameter of the largest particle 806, so, under both conditions illustrated in FIGS. 8B and 8C, the largest particle 806 will touch the surface of the wafer 802, and the chance of attaching to the surface of the wafer 802 will be very high, which is not desirable.

The thickness of liquid film on a wafer is related to the transfer speed of a robot which transfers the wafer. As shown in FIG. 9A, the thickness of liquid film 904 on the wafer 902 is thick. During the robot transferring the wafer 902 with the thick liquid film 904 thereon, if the transfer acceleration of the robot is large, it will cause the liquid film 904 to surge to the periphery of the wafer 902, so that the thickness of liquid film 904 on the periphery of the wafer 902 increases, as shown in FIG. 9C. If the thickness of liquid film 904 on the periphery of the wafer 902 is greater than the maximum thickness of liquid film being able to be held by the liquid surface tension, the liquid on the wafer 902 will drop from the periphery of the wafer 902 during the robot transferring the wafer 902. As shown in FIG. 9B, the thickness of liquid film 904 on the wafer 902 is thin, so that during the robot transferring the wafer 902, the transfer acceleration of the robot can be large as long as the thickness of liquid film 904 on the periphery of the wafer 902 is not greater than the maximum thickness of liquid film being able to be held by the liquid surface tension. Therefore, the liquid on the wafer 902 will not drop from the periphery of the wafer 902 during the robot transferring the wafer 902 and a certain thickness of liquid film 904 can be kept on the wafer 902 to reduce the chance of particles in the liquid film 904 to be attached to the surface of wafer 202.

In some embodiments, the second tank can be cancelled. The wafer is transferred to the first tank for implementing batch cleaning process, and then the wafer is taken out of the first tank and transferred to the single wafer cleaning module for implementing single wafer cleaning and drying processes. The description of FIG. 2 and FIG. 5 to FIG. 9 are applied herein to control and keep a certain thickness of liquid film on the wafer from the moment of the wafer out of the liquid in the first tank till the wafer is transferred to the single wafer cleaning module.

Figure 10:
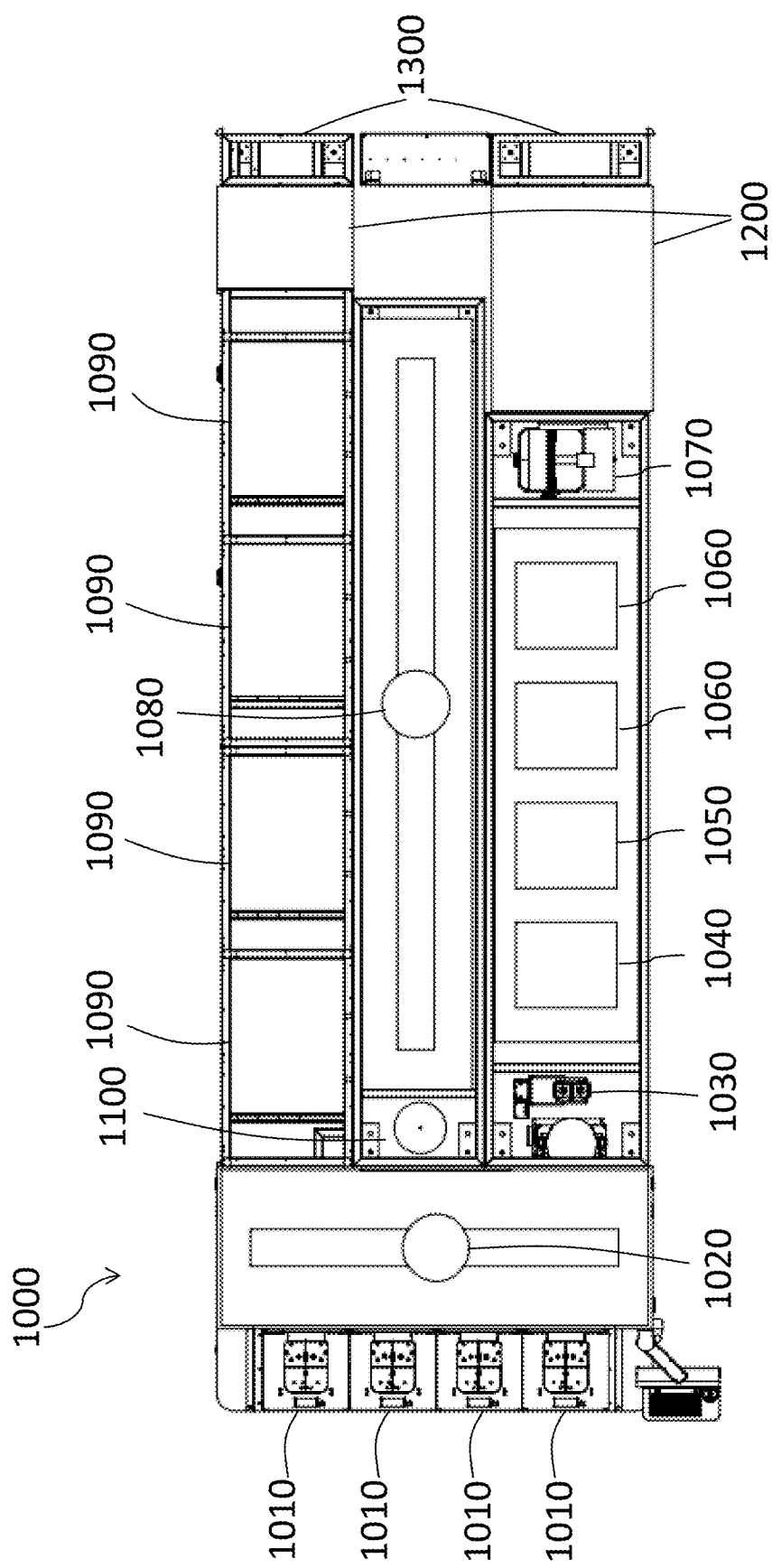
FIG. 10 is a top view of a cleaning apparatus according to an example embodiment of the present invention.
Figure 11:
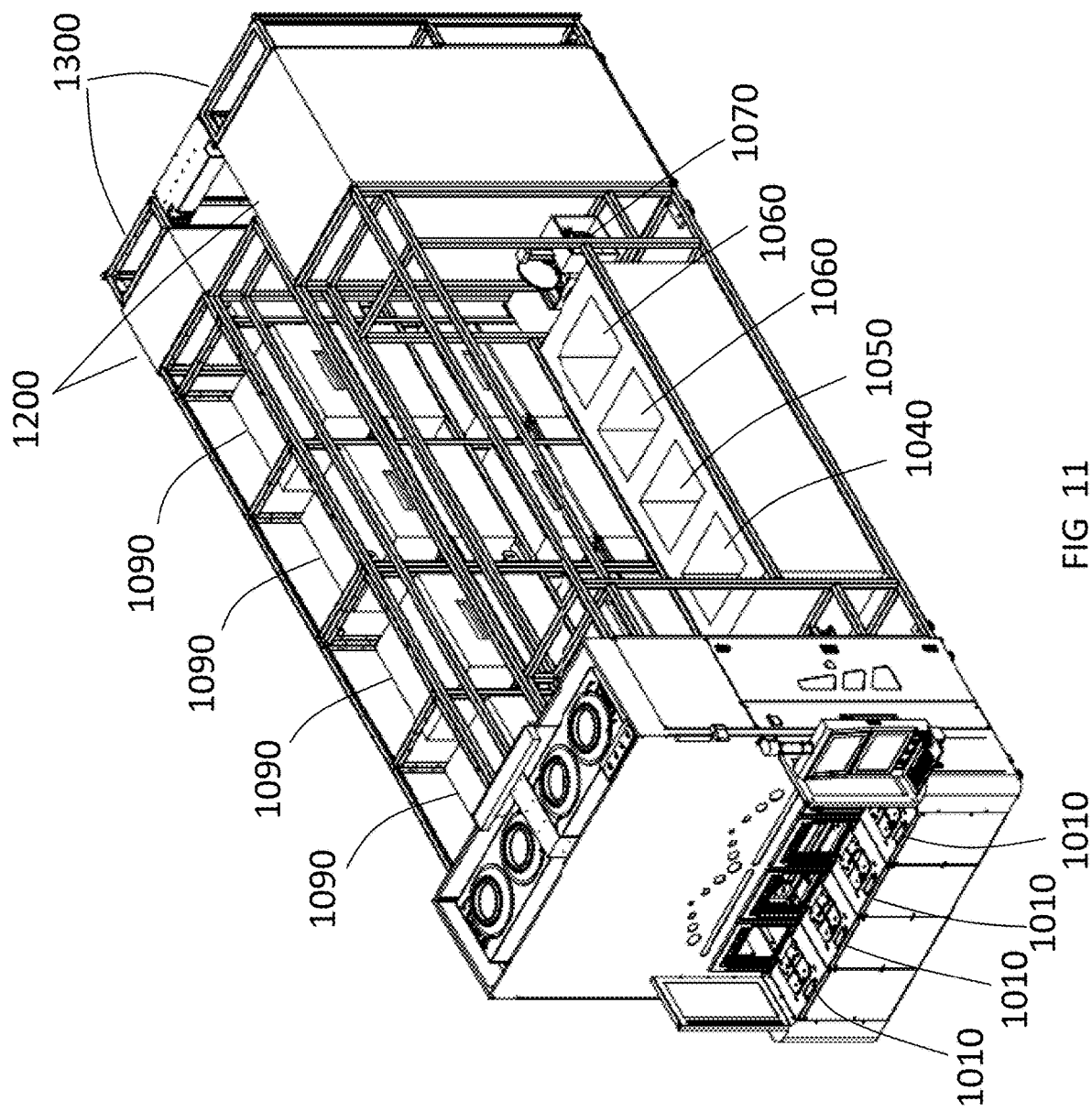
FIG. 11 is a perspective view of the cleaning apparatus shown in FIG. 10.
Figure 12:
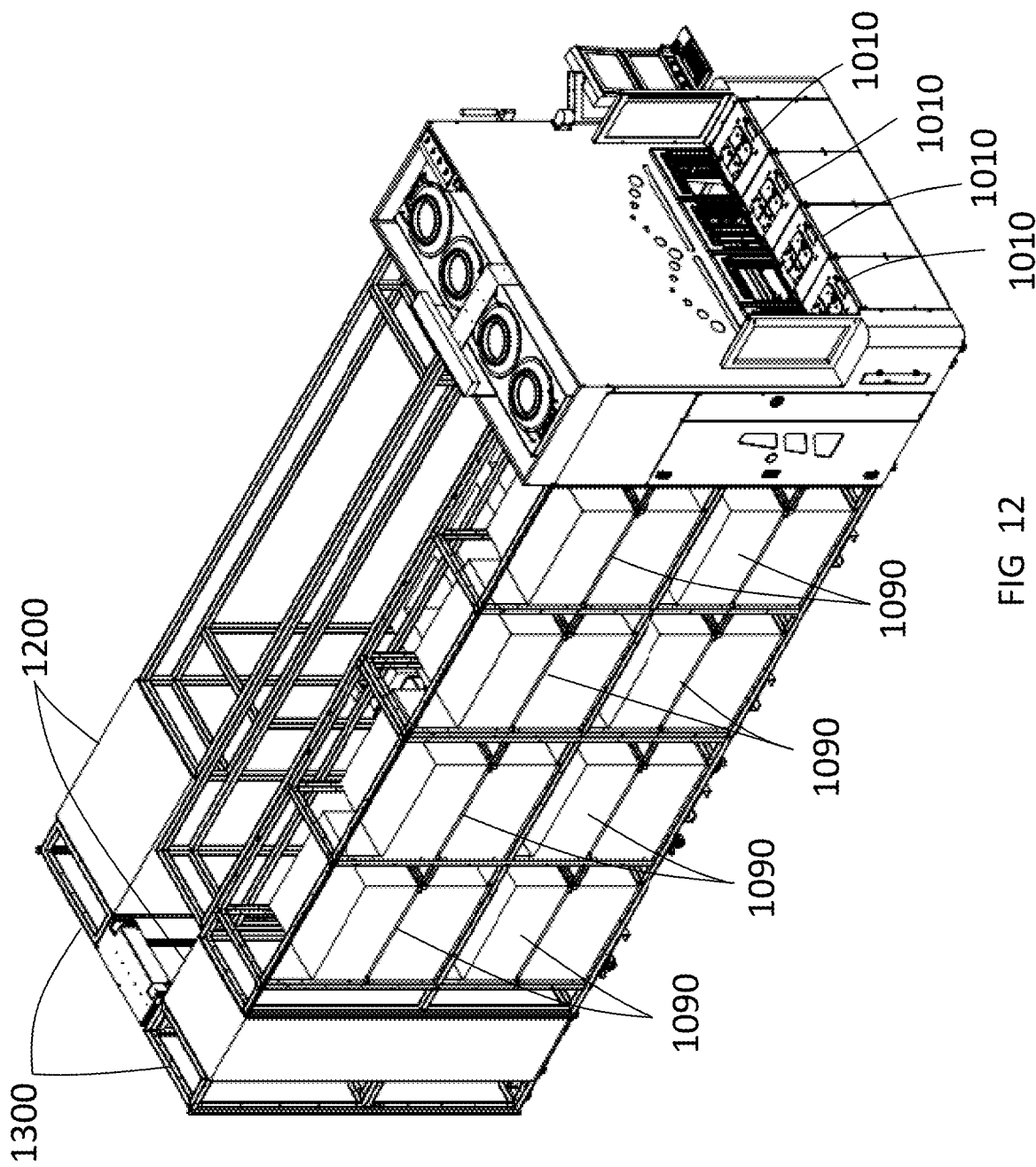
FIG. 12 is another perspective view of the cleaning apparatus shown in FIG. 10.

Please refer to FIG. 10 to FIG. 12, illustrating an apparatus for cleaning semiconductor wafers according to an example embodiment of the present invention. The apparatus 1000 includes a plurality of load ports 1010, an index robot 1020, a first turnover device 1030, a first wafer transfer robot, a cleaning tank 1040, at least one first tank 1050, one or more second tanks 1060, a second wafer transfer robot, a second turnover device 1070, a process robot 1080, one or more single wafer cleaning modules 1090, a buffer room 1100, a chemical deliver system 1200, an electric control system 1300 and a controller. The controller is configured to control the plurality of robots.

In an embodiment, the plurality of load ports 1010 is arranged side by side at one end of the apparatus 1000. In order to clarify the layout of the apparatus 1000 of the present invention, the arrangement of the plurality of load ports 1010 can be considered as transverse arrangement. The cleaning tank 1040, the at least one first tank 1050 and the one or more second tanks 1060 are arranged at one side of the apparatus 1000. The arrangement of the cleaning tank 1040, the at least one first tank 1050 and the one or more second tanks 1060 is lengthways arrangement. The one or more single wafer cleaning modules 1090 are arranged at the other side of the apparatus 1000 and opposing the cleaning tank 1040, the at least one first tank 1050, and the one or more second tanks 1060. The arrangement of the one or more single wafer cleaning modules 1090 is lengthways arrangement. There is a space between the one or more single wafer cleaning modules 1090 and the cleaning tank 1040, the at least one first tank 1050 and the one or more second tanks 1060. The process robot 1080 is arranged in the space and can move lengthways in the space. The chemical deliver system 1200 and the electric control system 1300 are arranged at the other end of the apparatus 1000, opposing the plurality of load ports 1010. The advantage of the layout of the apparatus 1000 is, (1) the transverse length or width of the apparatus 1000 is short and the lengthways length of the apparatus 1000 is long, which is more suitable for the requirement of semiconductor fabrication plants, (2) the apparatus 1000 can be expanded if necessary, such as increasing the number of the single wafer cleaning modules 1090 in lengthways direction and/or increasing the number of the first tanks 1050 and the number of the second tanks 1060 in lengthways direction. In an embodiment, the single wafer cleaning modules 1090 are arranged into two layers, as shown in FIG. 12. The single wafer cleaning modules can be arranged into more than two stacked layers in order to increase number of cleaning modules without increasing the footprint of the apparatus 1000. In an embodiment, the first turnover device 1030 is arranged adjacent to the cleaning tank 1040 and the second turnover device 1070 is arranged adjacent to the second tank 1060.

Figure 13:
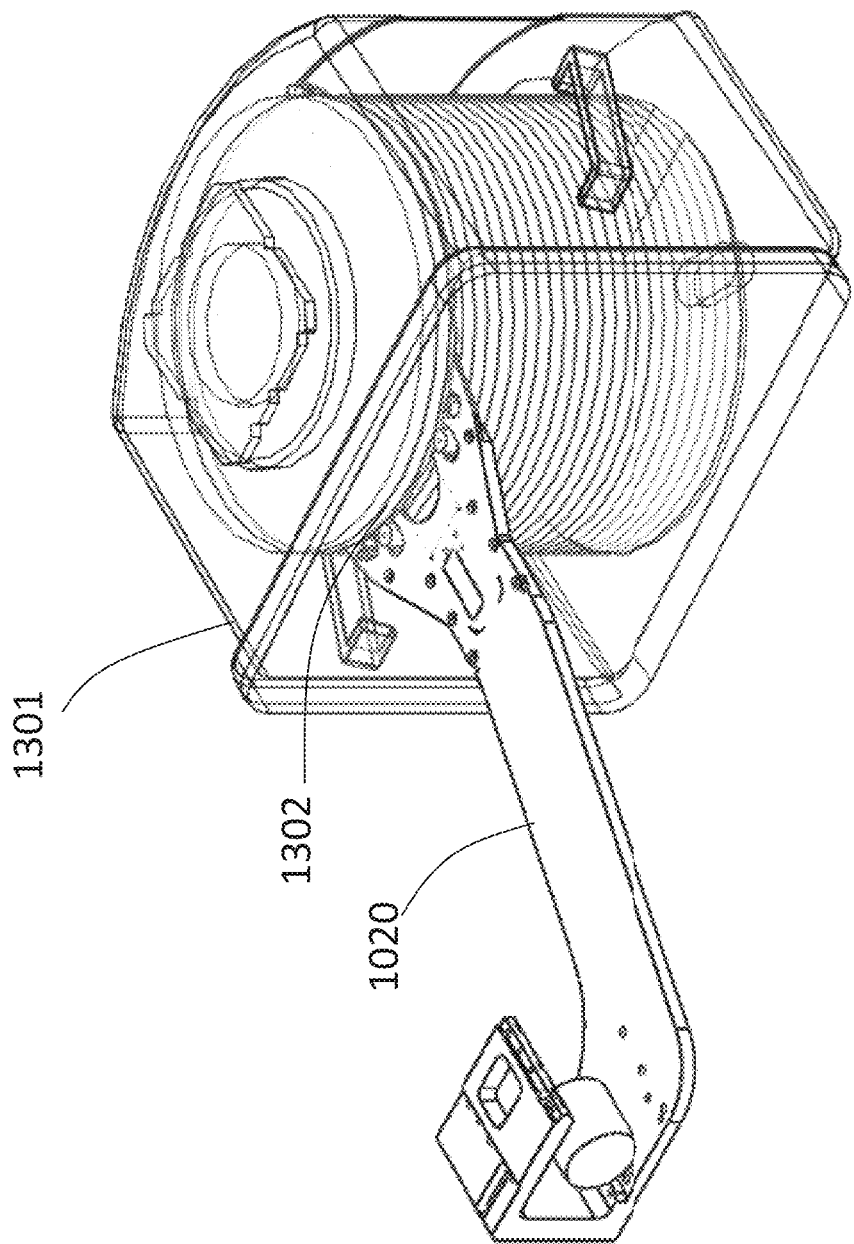
FIG. 13 depicts an index robot takes wafers from a wafer cassette.

Combining with FIG. 13, every load port 1010 is configured to receive a wafer cassette 1301. A plurality of wafers 1302, e.g. twenty five pieces of wafers can be loaded in the wafer cassette 1301. The index robot 1020 can transversely move. The index robot 1020 takes a plurality of wafers 1302 out of the wafer cassette 1301 and transfers the plurality of wafers 1302 to the first turnover device 1030.

With reference to FIG. 14A to FIG. 14D, the first turnover device 1030 has a pedestal 1031 and a support frame 1032. The support frame 1032 has two opposite side walls and a bottom wall connecting with the two opposite side walls. The bottom wall of the support frame 1032 is connected to the pedestal 1031 through a rotation shaft 1033. A first driving device 1034 is configured to drive the support frame 1032 to rotate via the rotation shaft 1033. The first turnover device 1030 has a wafer holding device 1035 rotatably installed on the two opposite side walls of the support frame 1032 via two rotation axes 1036. A second driving device 1037 is configured to drive either of the two rotation axes 1036 to rotate, thereby making the wafer holding device 1035 rotate. A lifting device 1038 is connected to a third driving device. The third driving device is configured to drive the lifting device 1038 to move up and down.

Figure 14A:
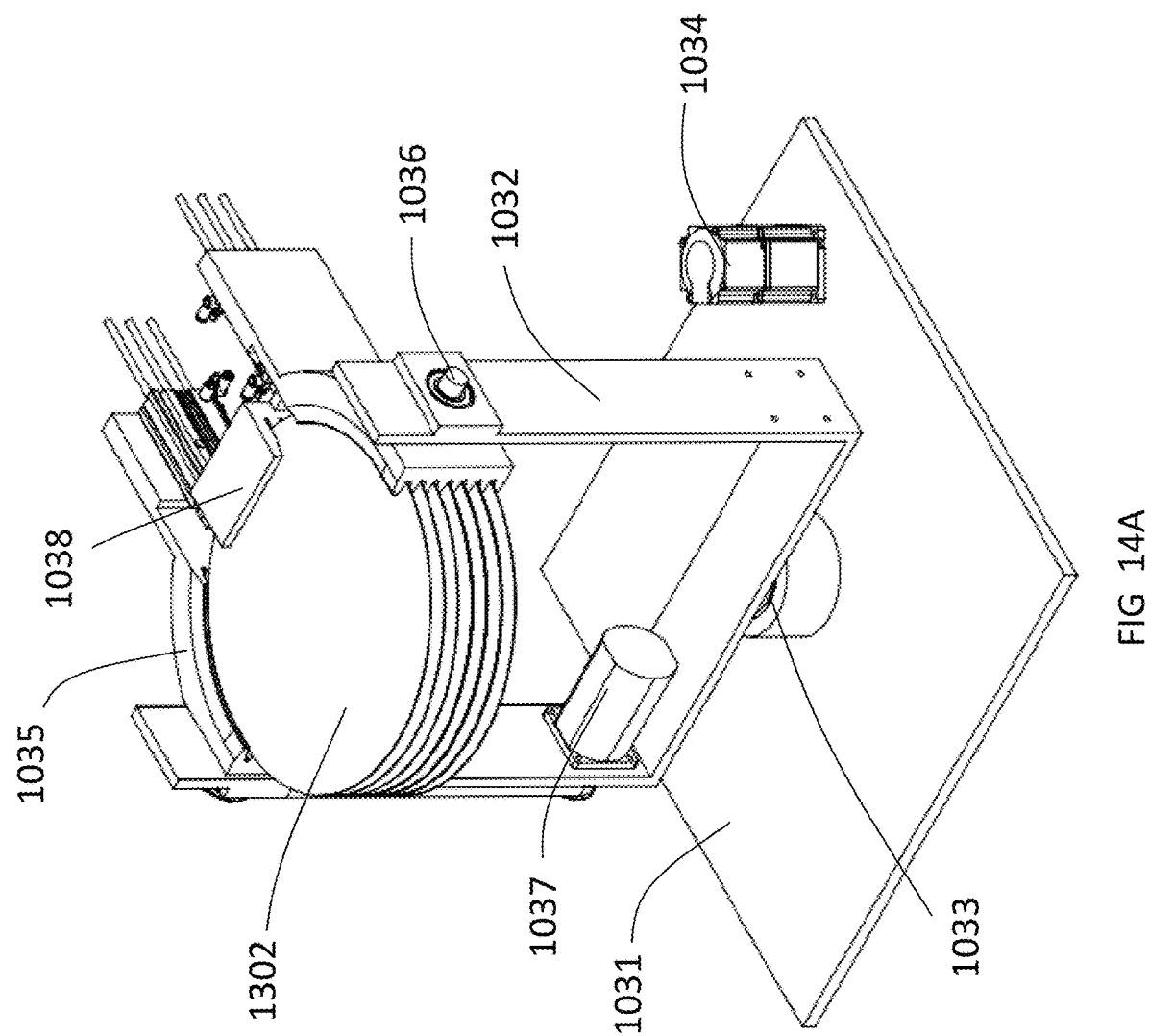
FIG. 14A to FIG. 14D depict a turnover process of the wafers put in a first turnover device according to an embodiment of the present invention.
Figure 14B:
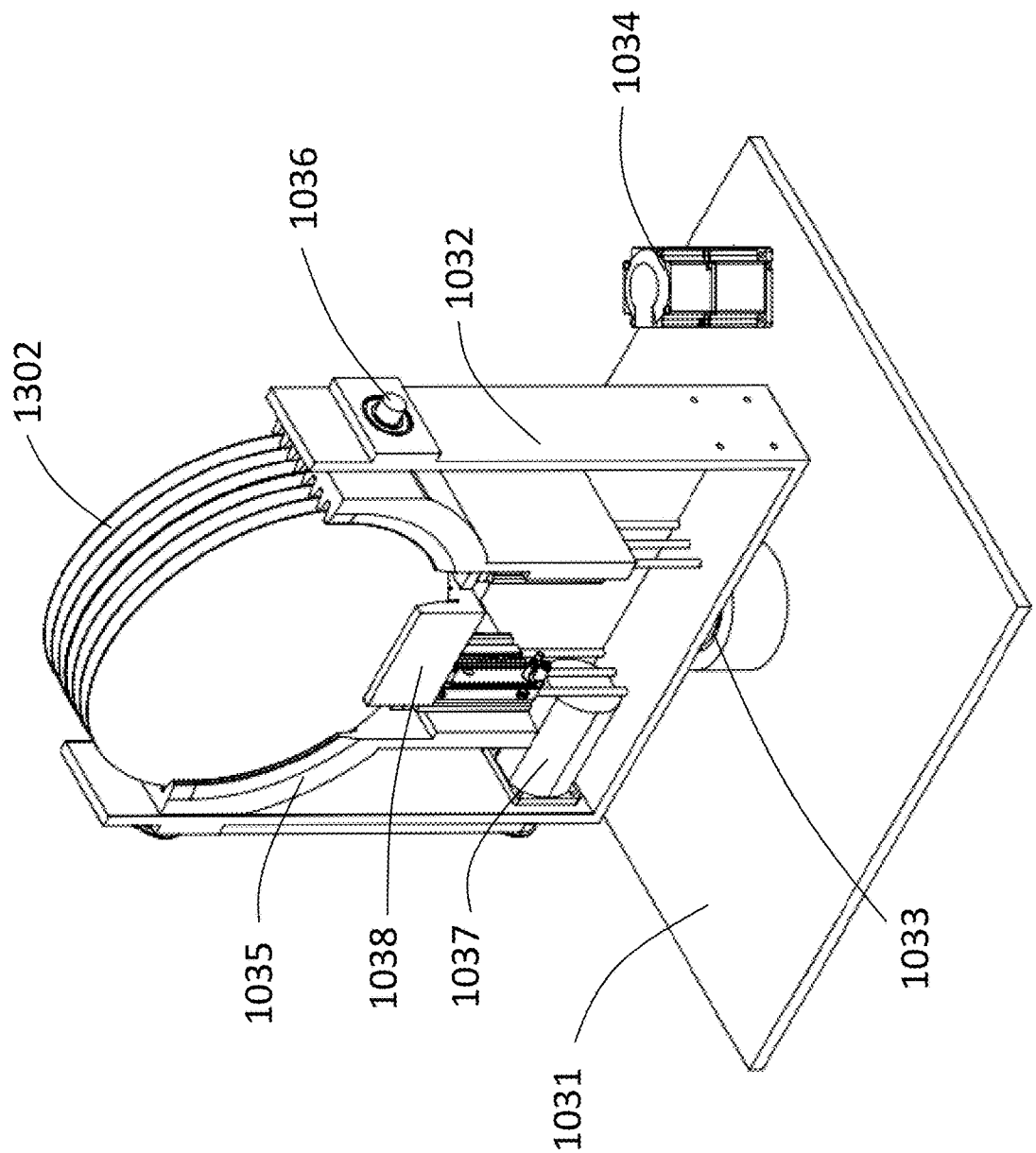
Figure 14C:
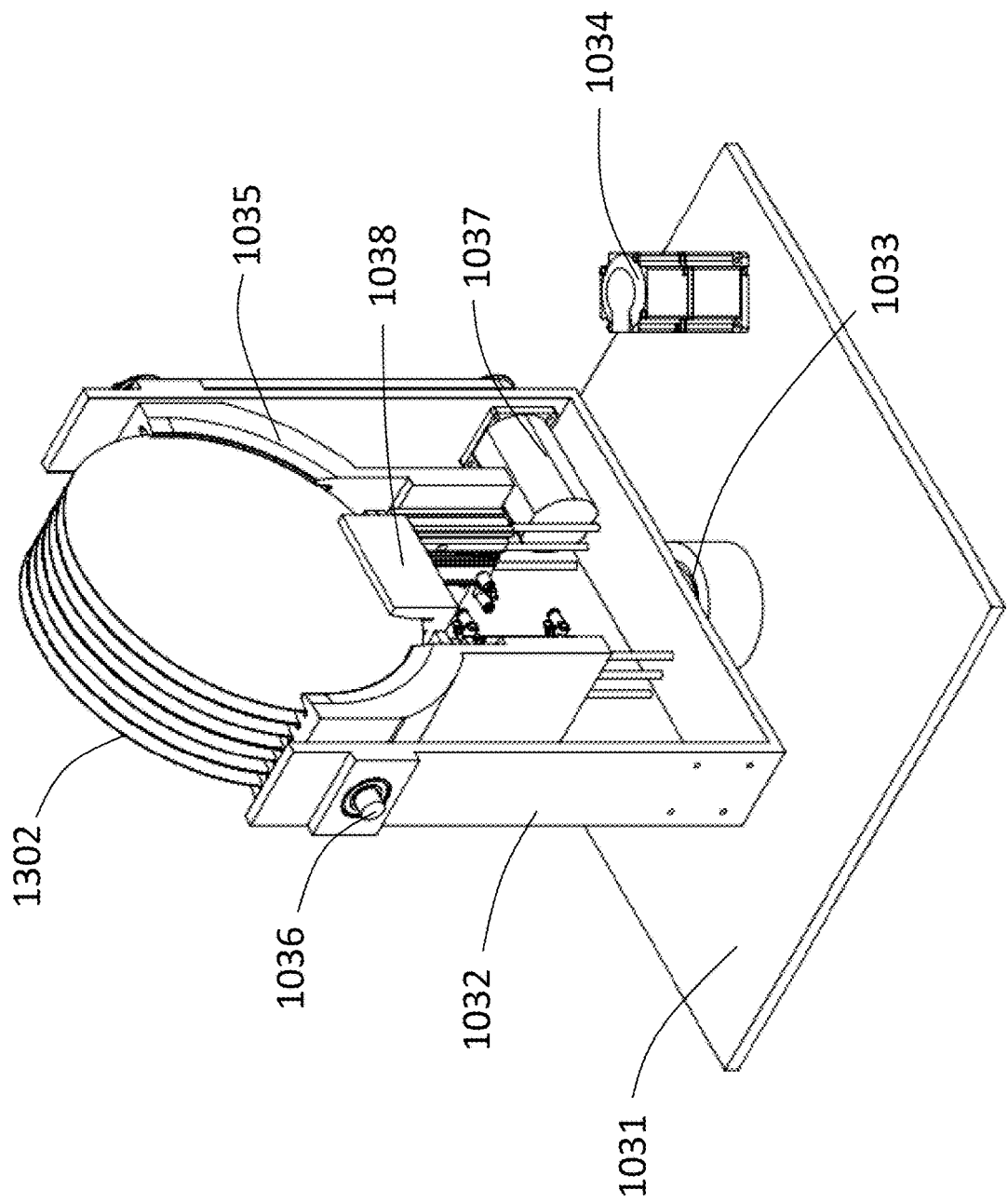
Figure 14D:
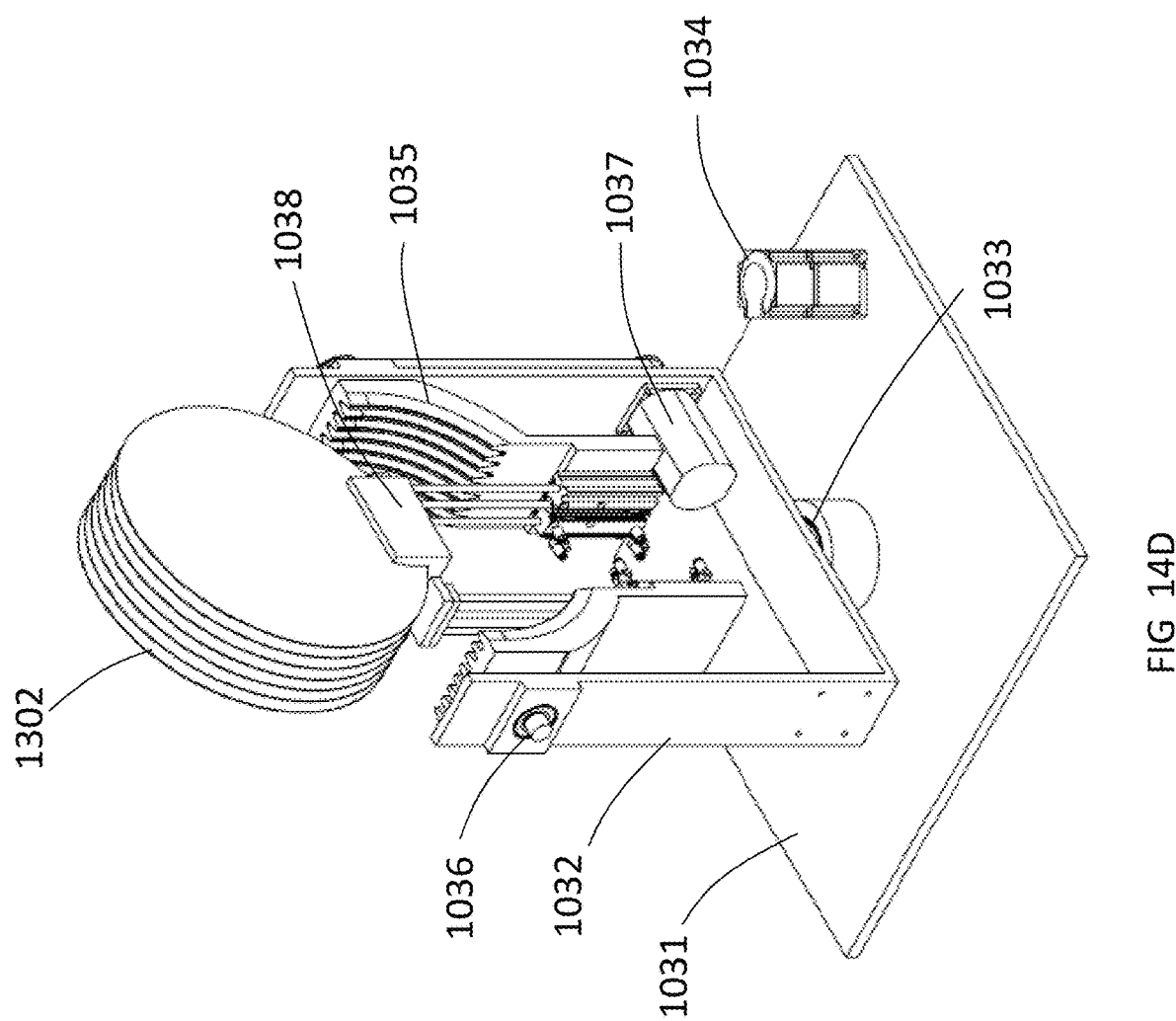

As shown in FIG. 14A, the index robot 1020 takes a plurality of wafers 1302 out of the wafer cassette 1301 and horizontally transfers the plurality of wafers 1302 to the wafer holding device 1035 of the first turnover device 1030. The plurality of wafers 1302 is horizontally held by the wafer holding device 1035. Then the second driving device 1037 drives either of the two rotation axes 1036 to rotate, thereby making the wafer holding device 1035 rotate 90 degrees, so that the plurality of wafers 1302 held by the wafer holding device 1035 is rotated from horizontal plane to vertical plane. The plurality of wafers 1302 is vertically held by the wafer holding device 1035, as shown in FIG. 14B. Then the first driving device 1034 drives the support frame 1032 to rotate 90 degrees, as shown in FIG. 14C, which is convenient for the first wafer transfer robot picking up the plurality of wafers 1302 from the lifting device 1038 and putting the plurality of wafers 1302 into the at least one first tank 1050. Subsequently, the third driving device drives the lifting device 1038 to move up to support the plurality of wafers 1302. The plurality of wafers 1302 is separated from the wafer holding device 1035 for the first wafer transfer robot to take the plurality of wafers 1035 from the lifting device 1038, as shown in FIG. 14D.

Optionally, after the plurality of wafers 1302 is horizontally transferred to the wafer holding device 1035 of the first turnover device 1030, the first driving device 1034 drives the support frame 1032 to rotate 90 degrees. Then the second driving device 1037 drives either of the two rotation axes 1036 to rotate, thereby making the wafer holding device 1035 rotate 90 degrees, so that the plurality of wafers 1302 held by the wafer holding device 1035 is rotated from horizontal plane to vertical plane. Subsequently, the third driving device drives the lifting device 1038 to move up to support the plurality of wafers 1302. The plurality of wafers 1302 is separated from the wafer holding device 1035 for the first wafer transfer robot to take the plurality of wafers 1035 from the lifting device 1038.

The first wafer transfer robot takes the plurality of wafers 1302 from the lifting device 1038 of the first turnover device 1030 and transfers the plurality of, e.g. six or seven wafers 1302 every time to the at least one first tank 1050. The plurality of wafers 1302 is put into the at least one first tank 1050 by the first wafer transfer robot. The at least one first tank 1050 is configured to implement batch cleaning for the plurality of wafers 1302. The at least one first tank 1050 contains cleaning chemical for cleaning the plurality of wafers 1302. The cleaning chemical in the at least one first tank 1050 can be SPM which is a mixture of $H_2SO_4$ and $H_2O_2$. The concentration ratio of $H_2SO_4$ and $H_2O_2$ can be 3:1 to 50:1, which is selectable according to different process requirements. The temperature of SPM can be 80° C. to 150° C., which is adjustable.

After the plurality of wafers 1302 has been processed in the at least one first tank 1050, the first wafer transfer robot takes the plurality of wafers 1302 out of the at least one first tank 1050 and transfers the plurality of wafers 1302 to the one or more second tanks 1060. The plurality of wafers 1302 is put into the one or more second tanks 1060 by the first wafer transfer robot. The one or more second tanks 1060 are configured to implement batch cleaning for the plurality of wafers 1302. In an example embodiment, there are two second tanks 1060. The plurality of wafers 1302 is divided into two groups and the two groups of wafers 1302 are respectively put into the two second tanks 1060. The plurality of wafers 1302 is implemented quickly dump rinse in the two second tanks 1060. The cleaning liquid for quickly dump rinse in the two second tanks 1060 can be deionized water. The temperature of deionized water can be from room temperature to 90° C.

According to an embodiment of the present invention, there is at least one first tank 1050 contains HF solution and at least one second tank 1060 contains $H_3PO_4$ solution. The other second tanks 1060 can contain deionized water for quickly dump rinse. The concentration of the HF solution can be 1:10 to 1:1000. The temperature of the HF solution can be set about 25° C. The concentration of the $H_3PO_4$ solution can be set about 86%. The temperature of the $H_3PO_4$ solution can be set 150° C.-200° C. The HF solution can be used to remove native silicon oxide before $H_3PO_4$ process. The $H_3PO_4$ solution can be used to remove silicon nitride.

The methods described in FIG. 2 to FIG. 3 and FIG. 7 can be applied herein to control and keep a certain thickness of liquid film on the plurality of wafers 1302 from the moment of the plurality of wafers 1302 out of the cleaning chemical in the at least one first tank 1050 till the plurality of wafers 1302 is put in the cleaning liquid of the one or more second tanks 1060.

The cleaning tank 1040 is configured to clean clamp arms of the first wafer transfer robot while the first wafer transfer robot is idle. While the first wafer transfer robot is idle, the first wafer transfer robot moves to the cleaning tank 1040 and is cleaned in the cleaning tank 1040.

After the plurality of wafers 1302 has been processed in the two second tanks 1060, the second wafer transfer robot takes a certain number of wafers 1302 out of the two second tanks 1060 every time and transfers the certain number of wafers 1302 to the second turnover device 1070. The number of wafers 1302 that is taken out of the two second tanks 1060 every time can be equal to or less than the number of the single wafer cleaning modules 1090. In order to reduce exposure time of wafers 1302 to air and prevent the wafers 1302 from drying after the wafers 1302 are taken out of the second tanks 1060, preferably, the number of wafers 1302 that is taken out of the two second tanks 1060 every time is one or two or less than ten.

Figure 15:
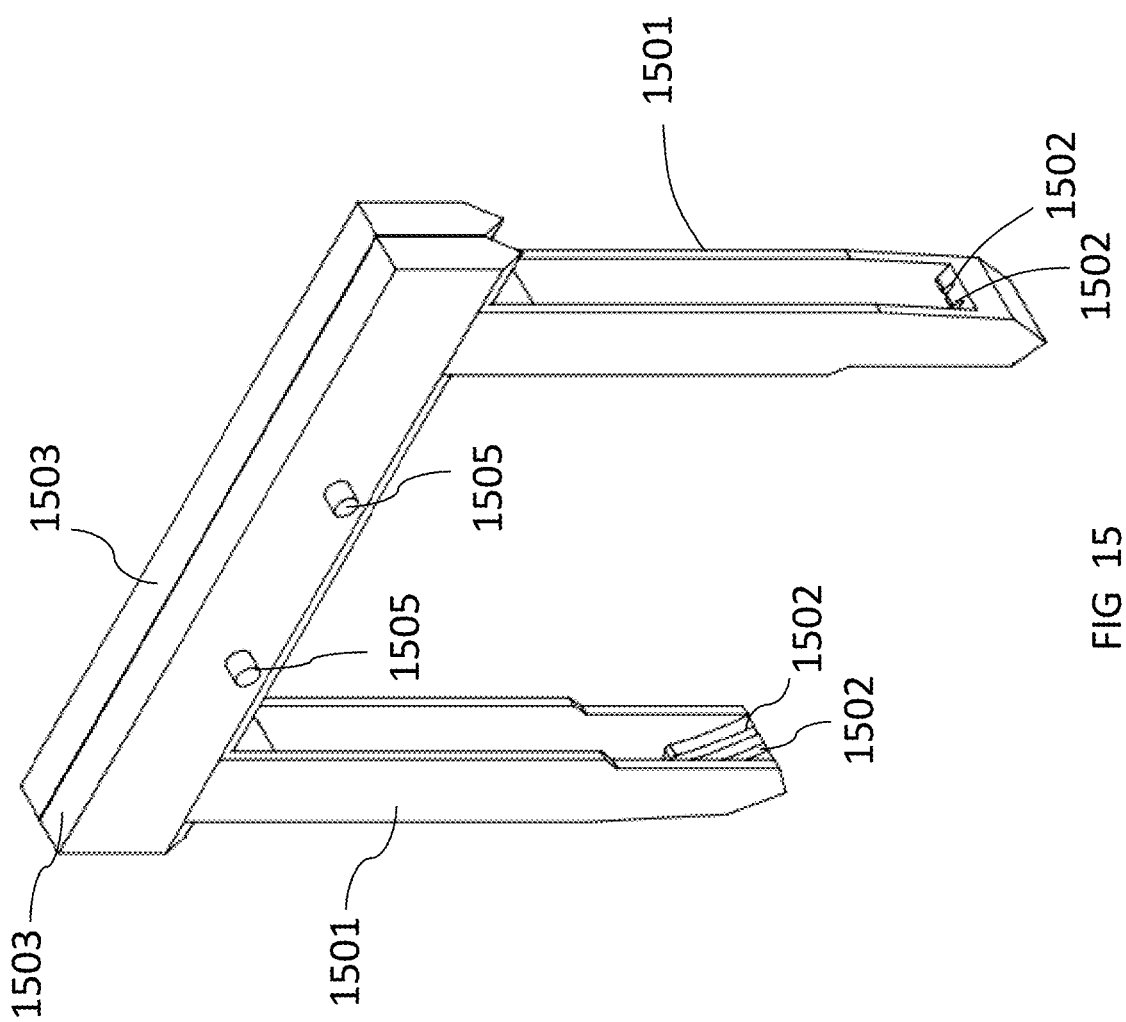
FIG. 15 is a perspective view of clamp arms of a second wafer transfer robot according to an embodiment of the present invention.
Figure 16:
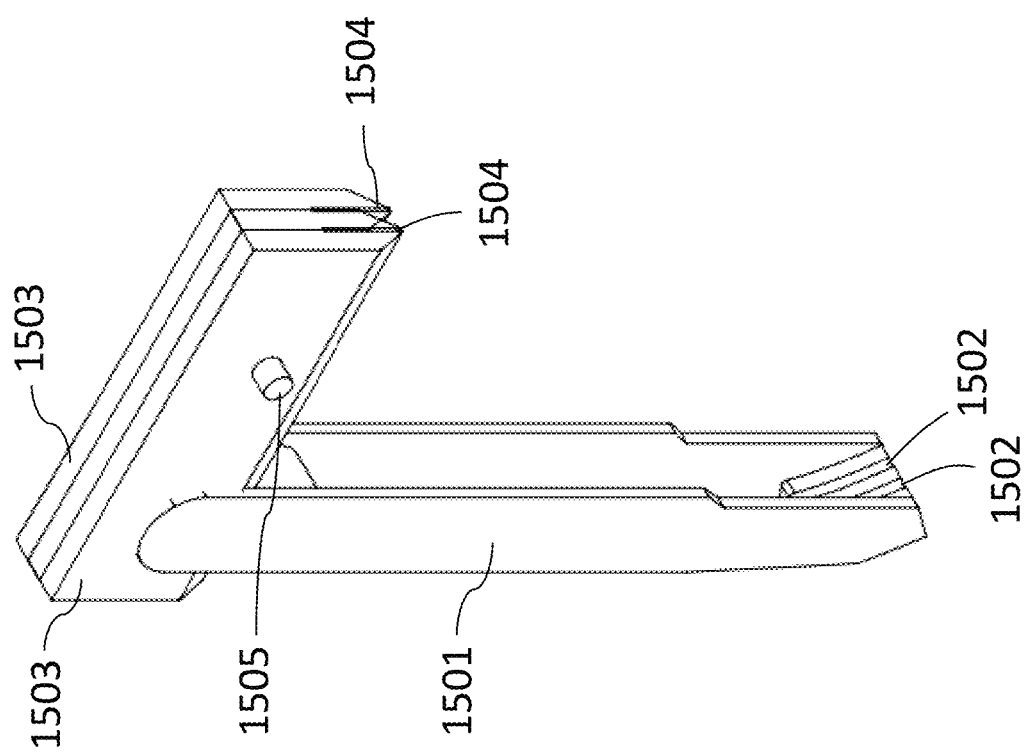
FIG. 16 is a cross-sectional view of the clamp arms of the second wafer transfer robot shown in FIG. 15.

With reference to FIGS. 15-16, an example second wafer transfer robot is illustrated according to the present invention. The second wafer transfer robot has a pair of clamp arms 1501. An end of each clamp arm 1501 defines two clamp slots 1502 for holding two wafers while the second wafer transfer robot is used to transfer wafers. The other end of each clamp arm 1501 is movably connected to two nozzle devices 1503 so that the pair of clamp arms 1501 can be opened outward to pick up and release the wafers 1302 or closed inward to clamp the wafers 1302. The two nozzle devices 1503 are long strip shape and arranged horizontally side by side. Every nozzle device 1503 has a slit-shaped nozzle 1504 and at least one, e.g. two inlets 1505 connecting to the slit-shaped nozzle 1504 for supplying liquid to the slit-shaped nozzle 1504. When the second wafer transfer robot is used to take the wafers 1302 from either of the two second tanks 1060 and transfer the wafers 1302 to the second turnover device 1070, the nozzle devices 1503 can be turned on for spraying liquid on the wafers 1302 through the slit-shaped nozzles 1504 to control and keep a certain thickness of liquid film on the wafers 1302, or turned off to stop spraying liquid on the wafers 1302. The flow of the liquid supplied to the nozzles 1504 can be adjustable according to process requirements, for example, 5 lpm to 30 lpm for 300 mm wafer. The size of the nozzles 1504 can be set according to process requirements, normally slit width of 1 mm to 4 mm, and length larger than wafer diameter. The number of the nozzle devices 1503 is matched with the number of the wafers 1302 clamped by the pair of clamp arms 1501 so that one nozzle device 1503 is corresponding to one wafer 1302 and sprays liquid on the one wafer 1302.

Figure 17:
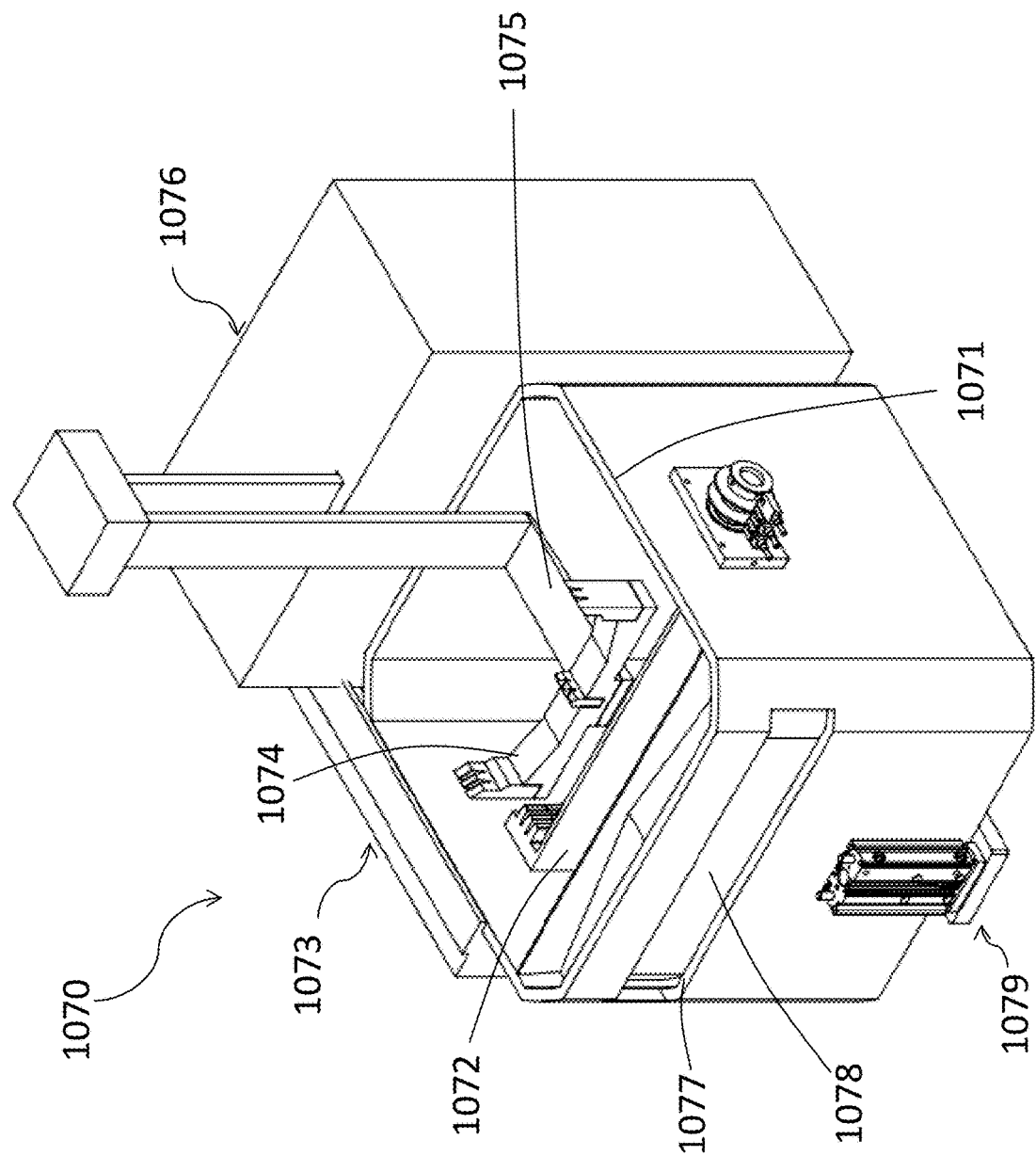
FIG. 17 is a perspective view of a second turnover device according to an embodiment of the present invention.
Figure 18:
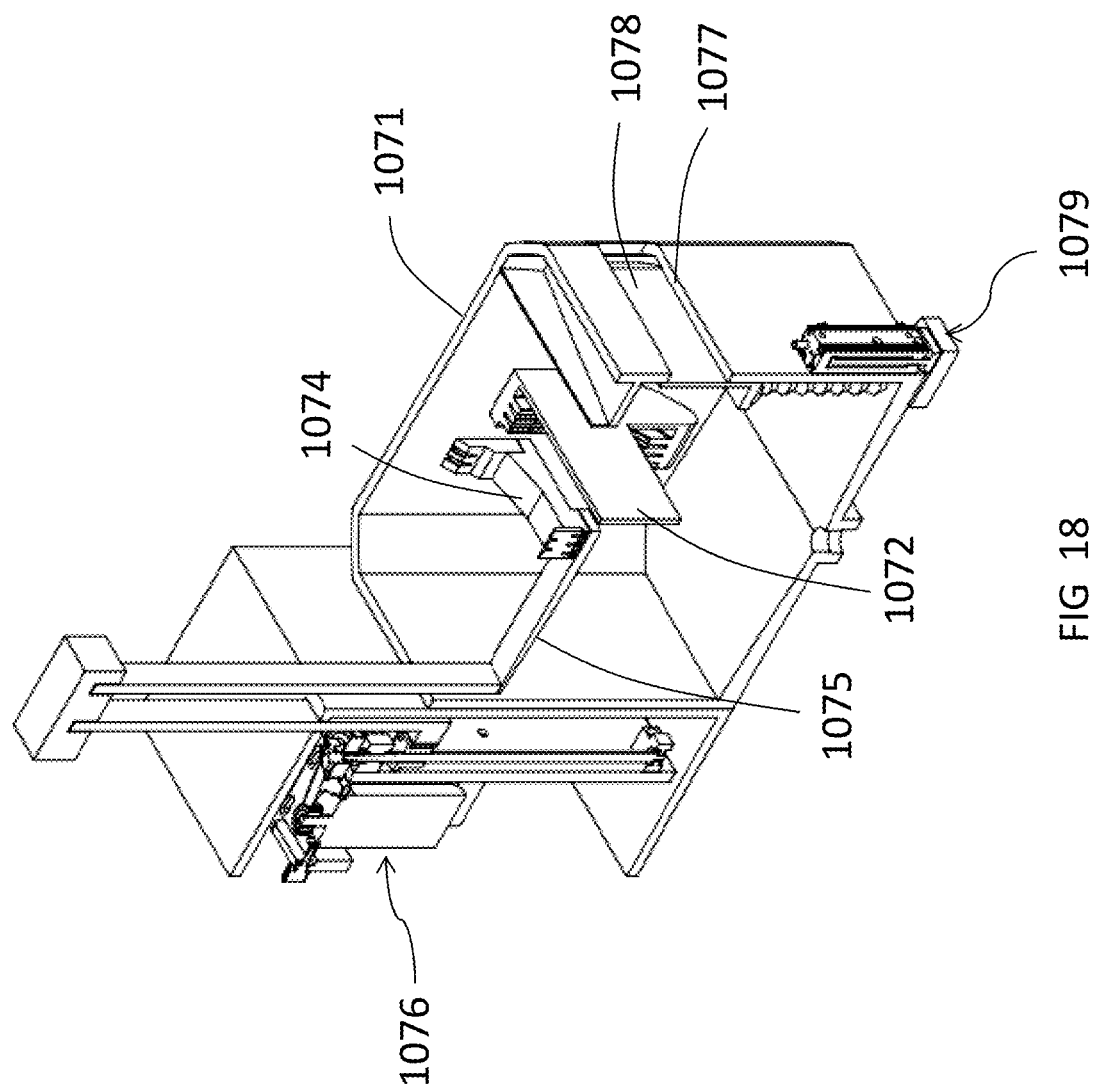
FIG. 18 is a cross-sectional view of the second turnover device shown in FIG. 17.
Figure 19:
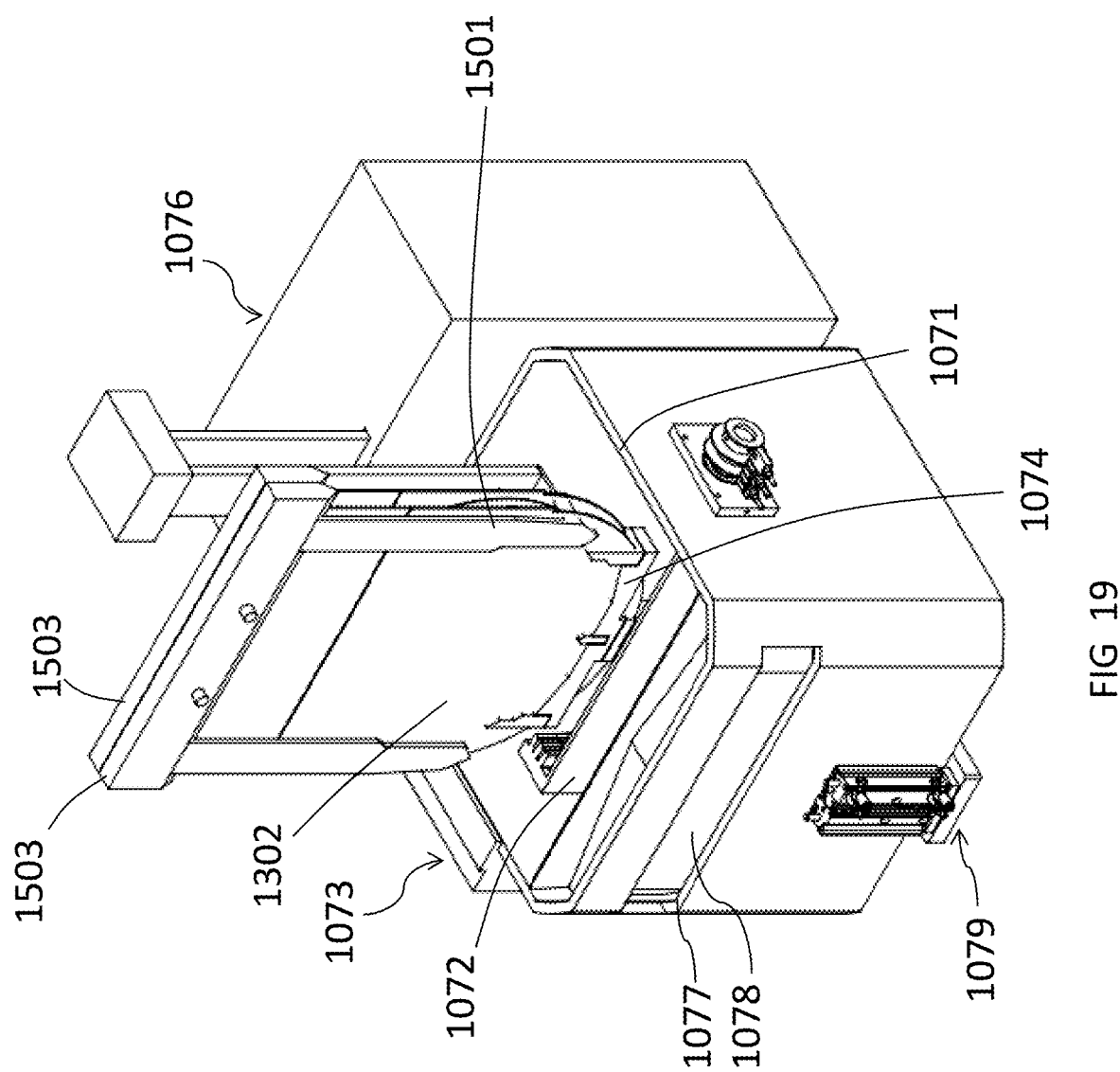
FIG. 19 depicts the second wafer transfer robot puts two wafers on a support seat of the second turnover device, wherein liquid is being sprayed on the two wafers all the time according to the present invention.
Figure 20:
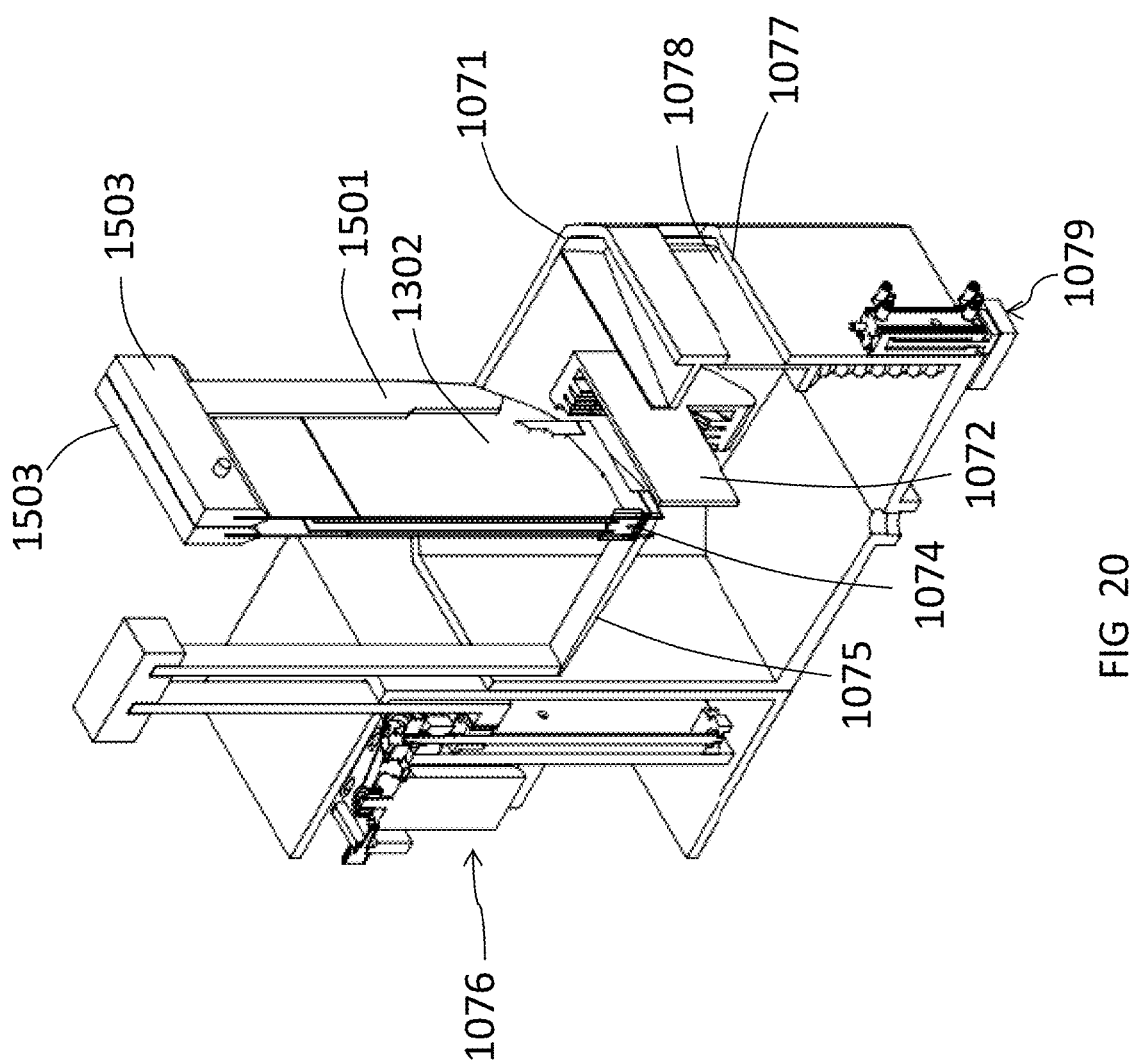
FIG. 20 is a cross-sectional view of FIG. 19.
Figure 21:
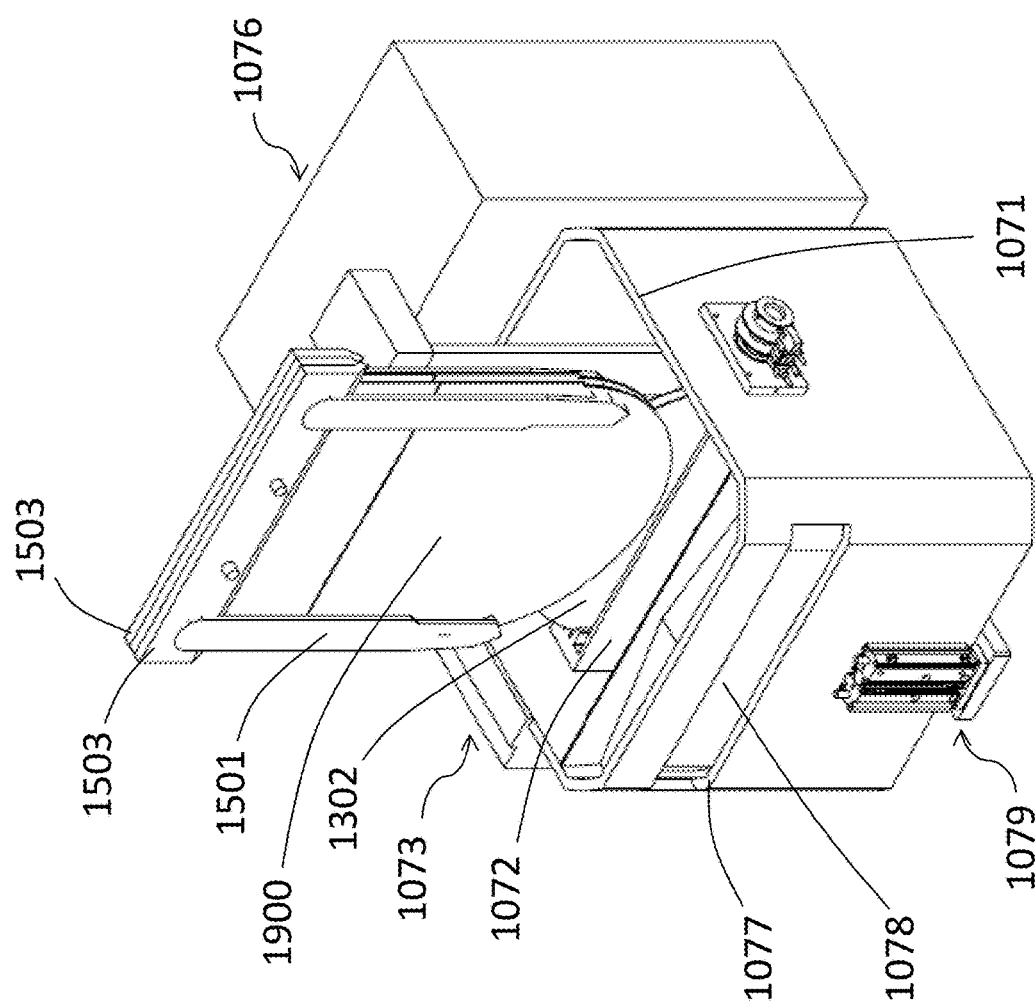
FIG. 21 depicts the two wafers are held by a wafer holder of the second turnover device and separate from the support seat of the second turnover device, wherein the liquid is yet being sprayed on the two wafers all the time according to the present invention.
Figure 22:
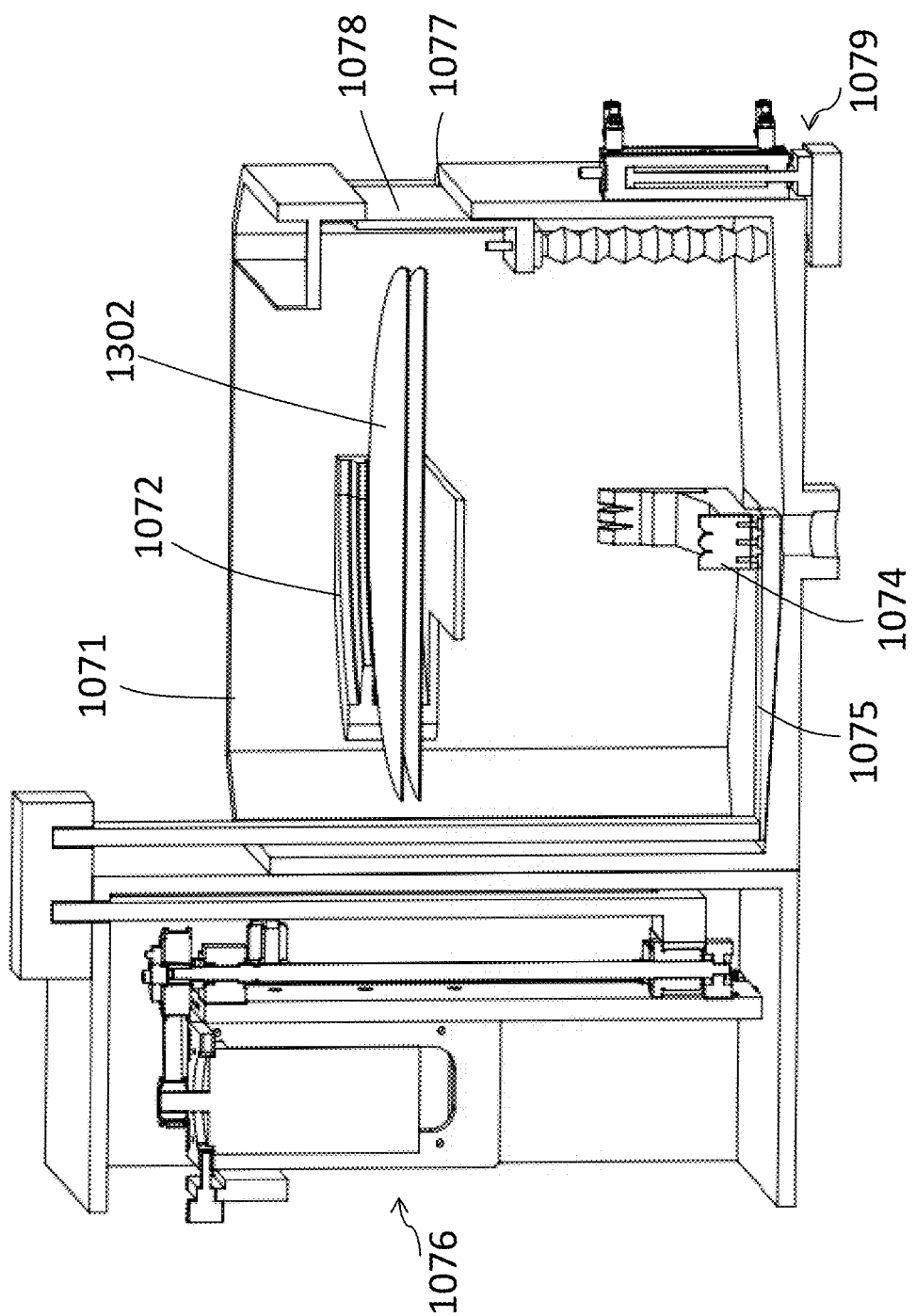
FIG. 22 depicts stopping spraying the liquid on the two wafers and turning the two wafers from a vertical plane to a horizontal plane.
Figure 23:
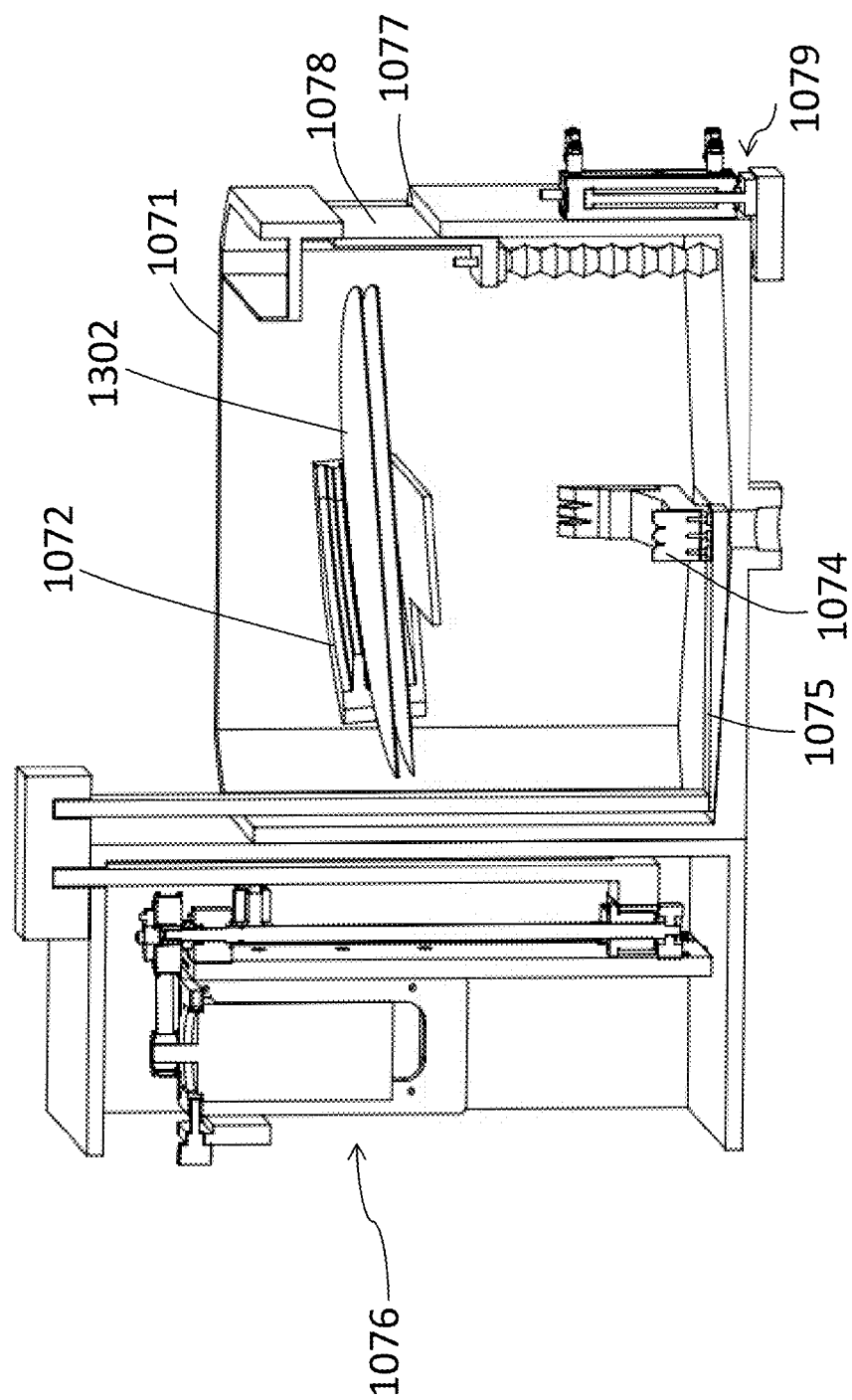
FIG. 23 depicts the two wafers are turned from the horizontal plane to an inclined plane by the second turnover device.
Figure 24:
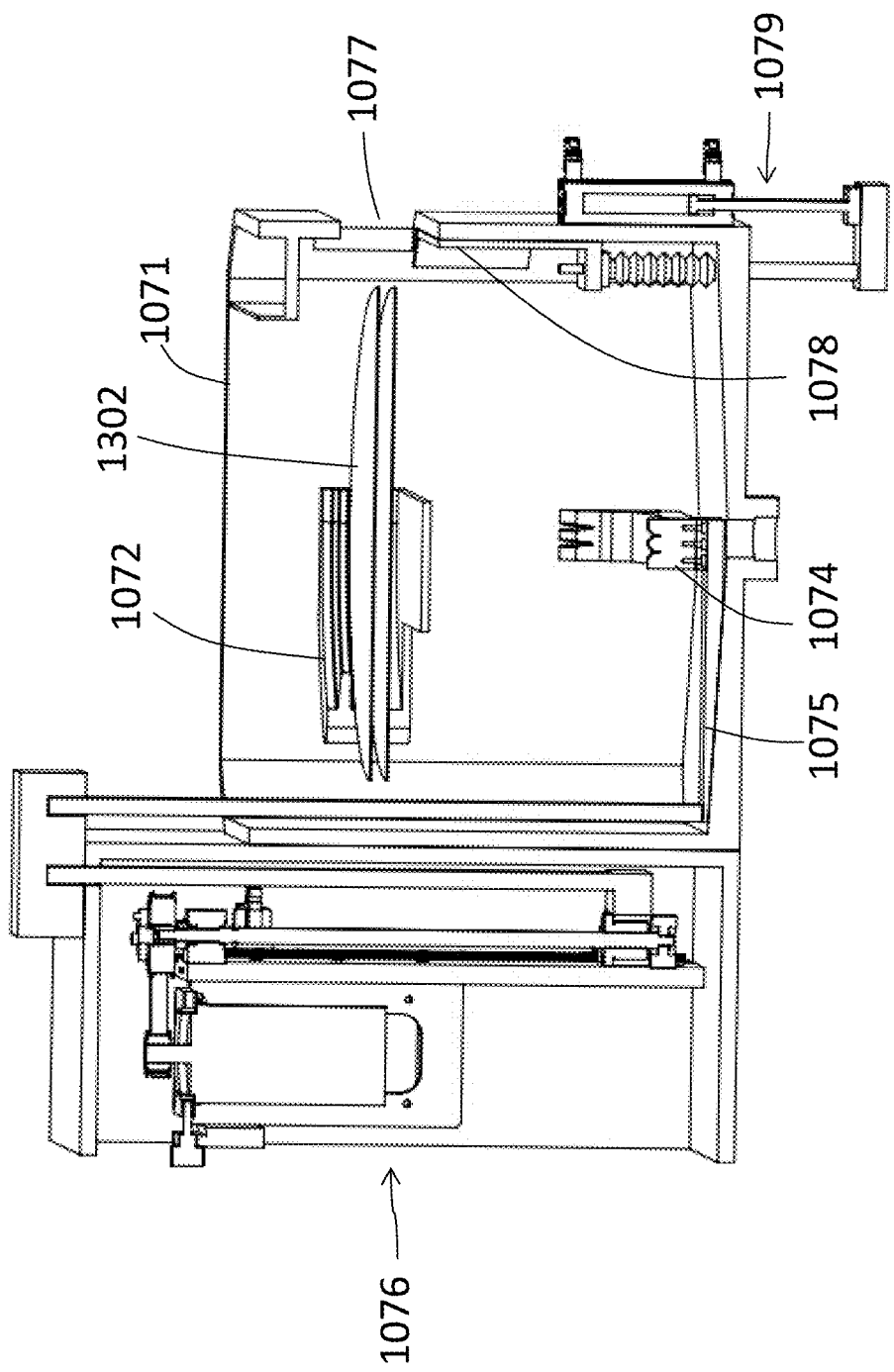
FIG. 24 depicts the two wafers are turned from the inclined plane to the horizontal plane by the second turnover device according to the present invention.
Figure 25:
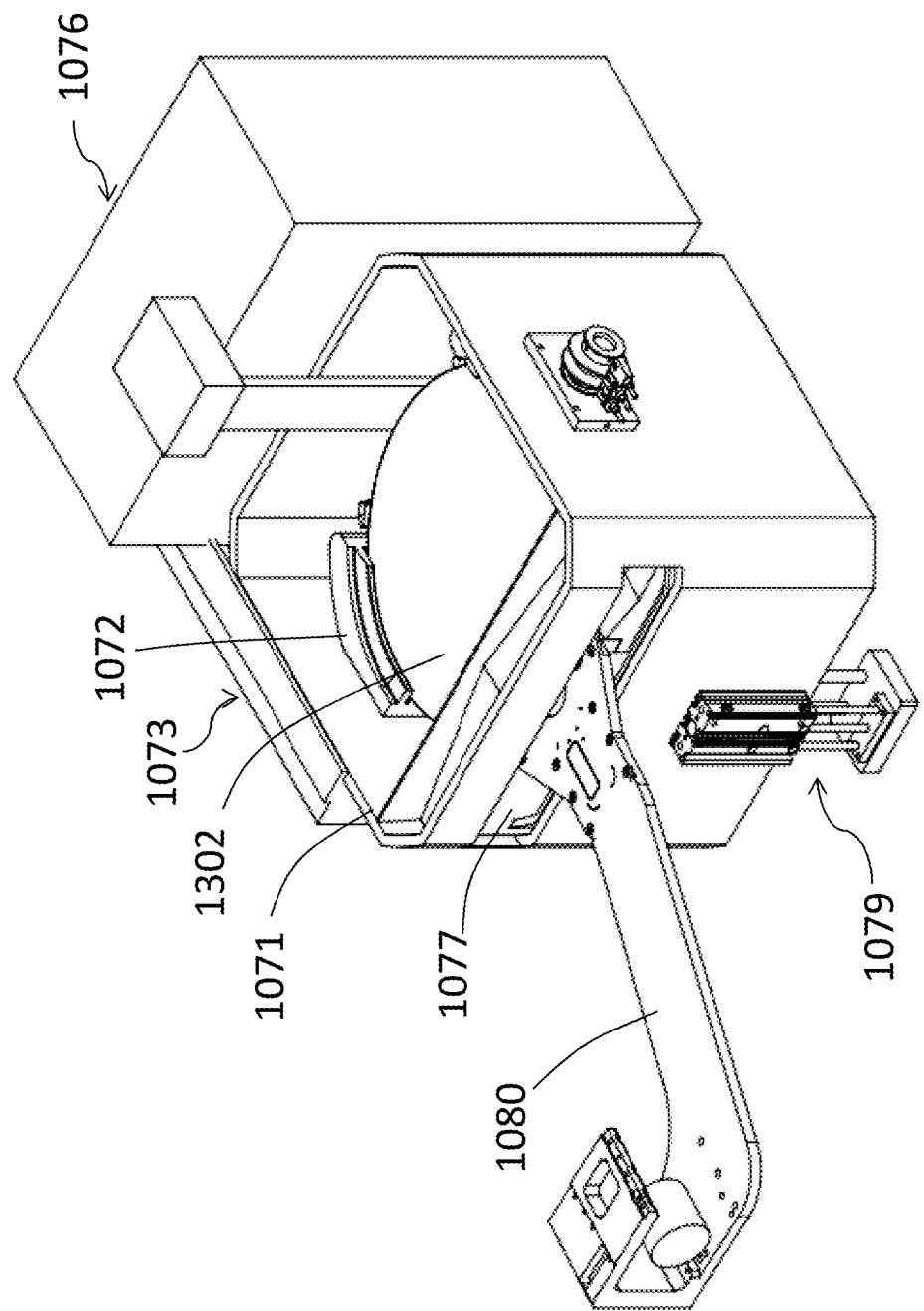
FIG. 25 depicts a process robot takes the two wafers out of the second turnover device according to the present invention.
Figure 26:
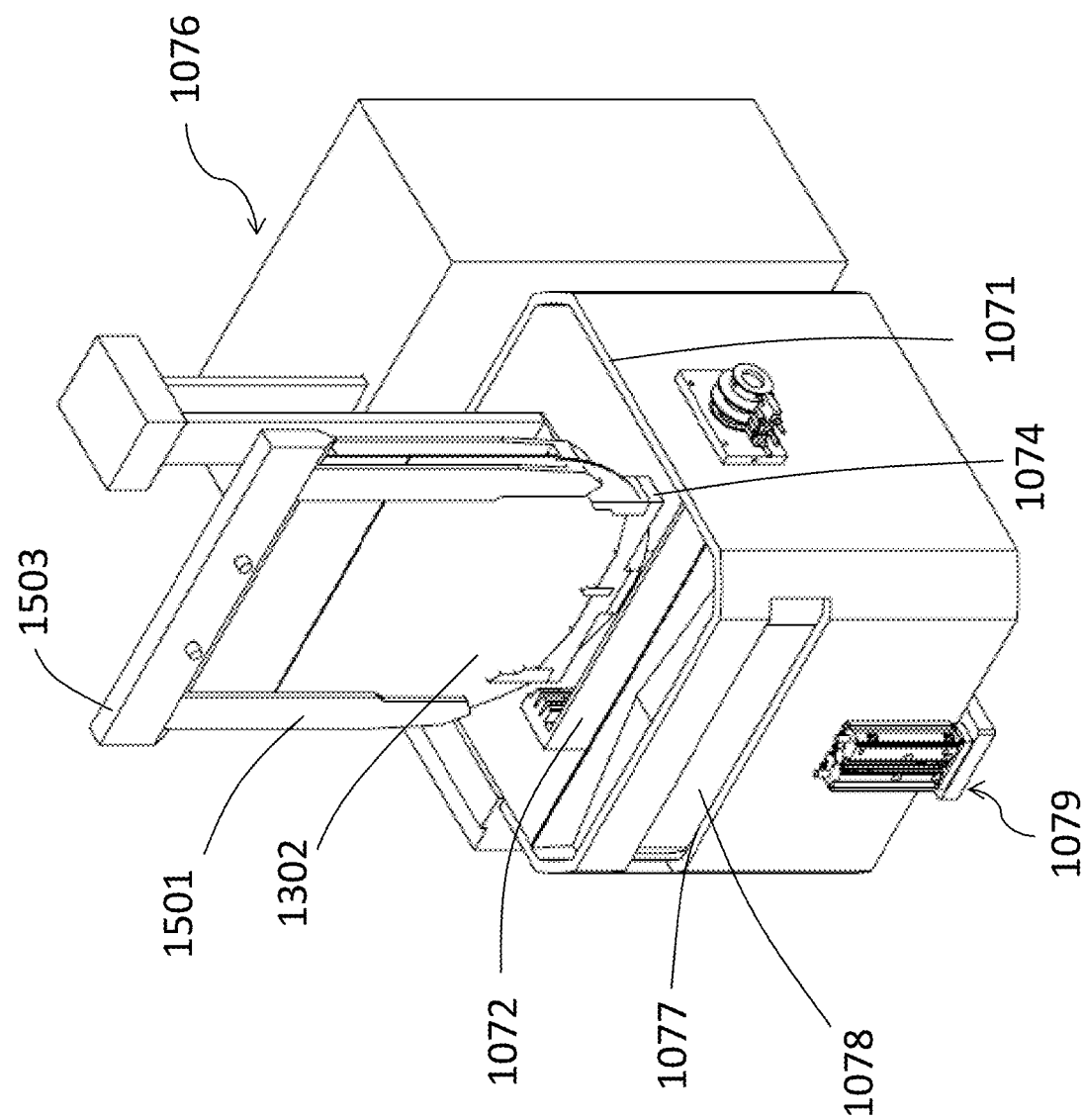
FIG. 26 depicts the second wafer transfer robot puts one wafer on the support seat of the second turnover device, wherein liquid is being sprayed on the one wafer all the time according to the present invention.
Figure 27:
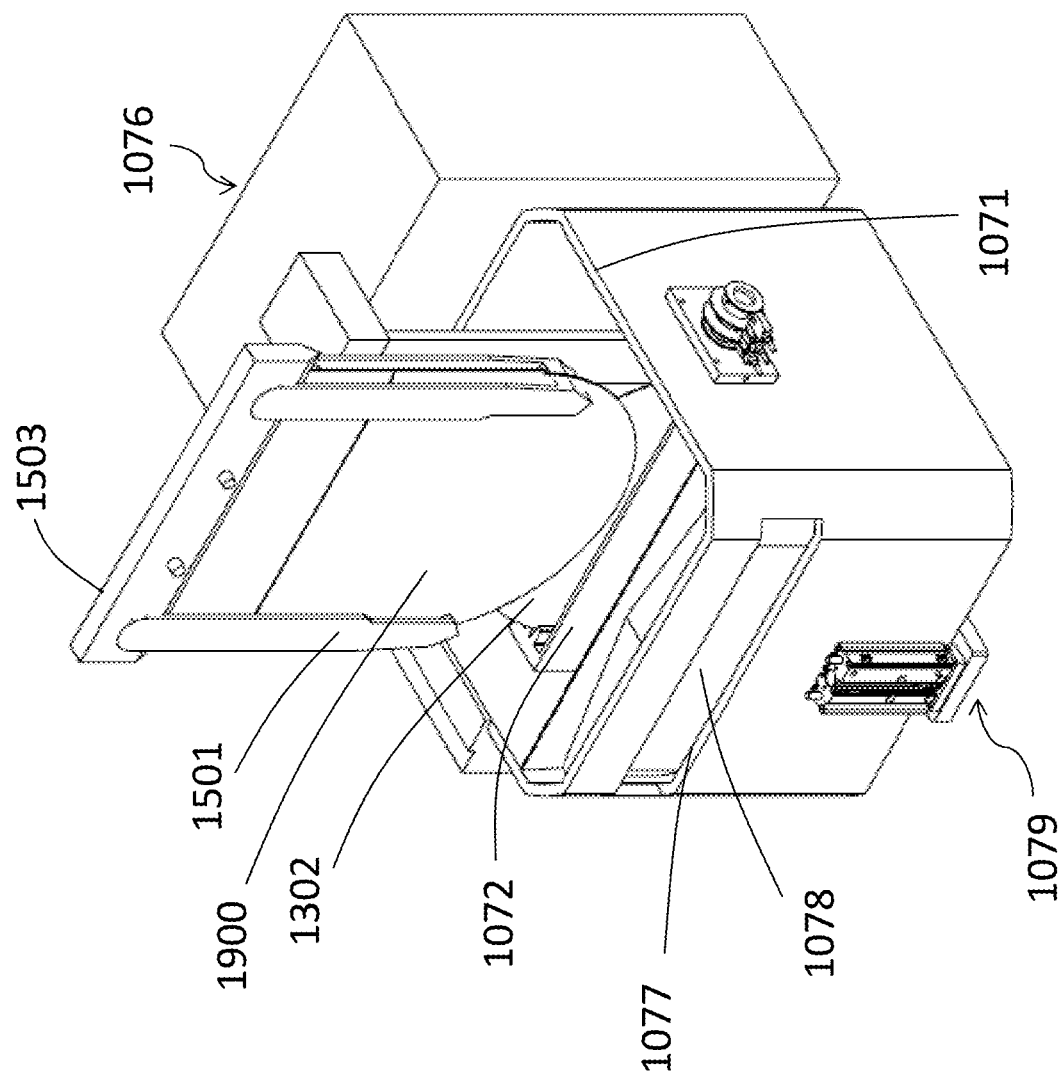
FIG. 27 depicts the one wafer is held by the wafer holder of the second turnover device and separates from the support seat of the second turnover device, wherein the liquid is yet being sprayed on the one wafer all the time according to the present invention.
Figure 28:
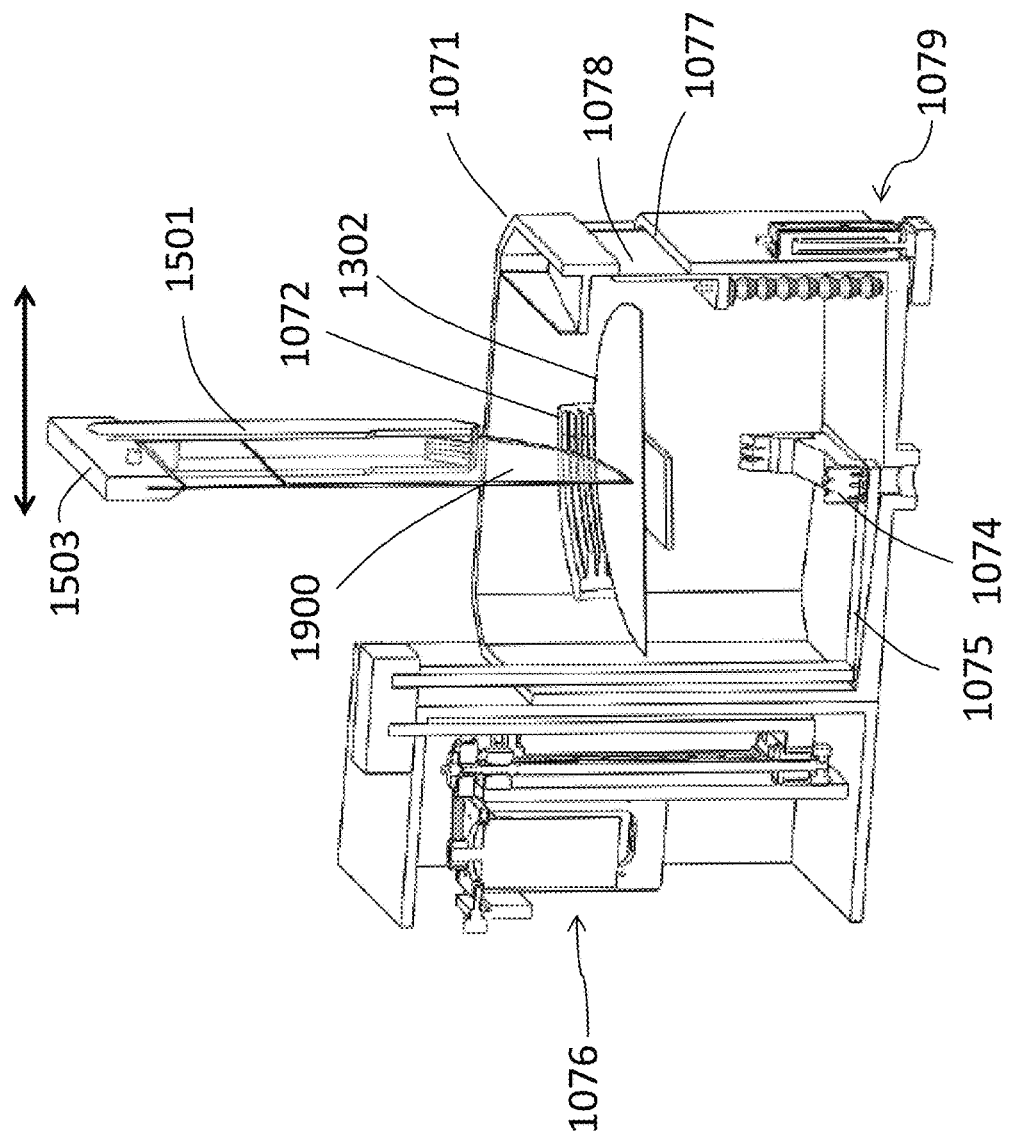
FIG. 28 depicts the one wafer is turned from a vertical plane to an inclined plane by the second turnover device, wherein the liquid is yet being sprayed on the one wafer all the time according to the present invention.
Figure 29:
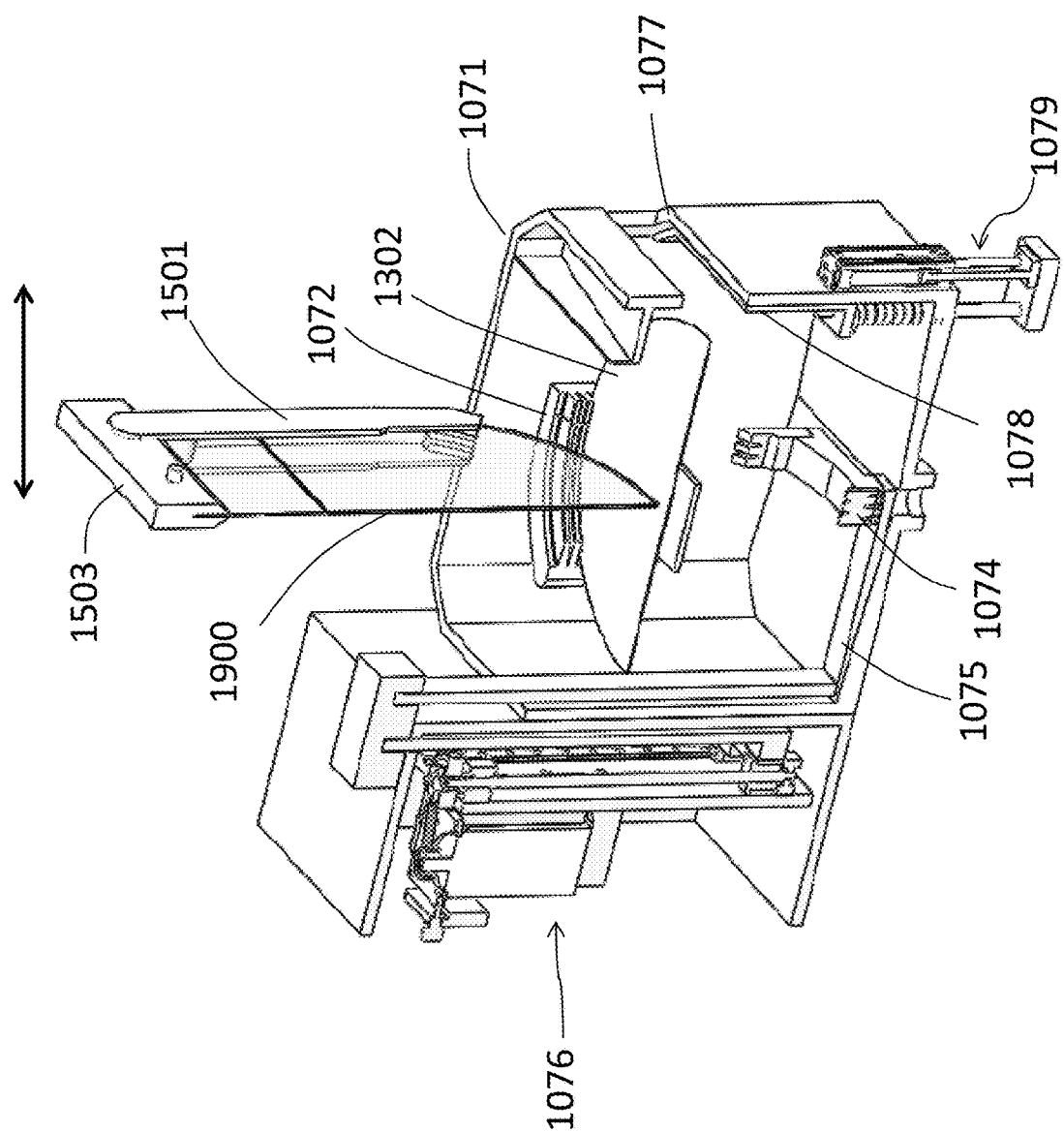
FIG. 29 depicts the one wafer is turned from the inclined plane to an horizontal plane by the second turnover device, wherein the liquid is yet being sprayed on the one wafer all the time according to the present invention.

Referring to FIGS. 17-18, an example second turnover device 1070 is illustrated according to the present invention. The second turnover device 1070 has a receiving chamber 1071. The receiving chamber 1071 is roughly in rectangular shape. A wafer holder 1072 is set in the receiving chamber 1071. Specifically, the wafer holder 1072 is movably installed on opposite side walls of the receiving chamber 1071. A first driving mechanism 1073 is configured to connect with the wafer holder 1072 and drive the wafer holder 1072 to rotate in the receiving chamber 1071. A support seat 1074 is fixed at an end of a support bar 1075. The end of the support bar 1075 extends to the receiving chamber 1071 so that the support seat 1074 is set in the receiving chamber 1071. The other end of the support bar 1075 is connected to a second driving mechanism 1076 through a connecting component. The second driving mechanism 1076 is configured to drive the support seat 1074 to ascend and descend. The receiving chamber 1071 defines a window 1077 on a side wall thereof. A door 1078 is set in the receiving chamber 1071. The door 1078 is connected to a third driving mechanism 1079. The third driving mechanism 1079 is configured to drive the door 1078 to move up to close the window 1077 or move down to open the window 1077.

Referring to FIG. 19 to FIG. 25, according to an embodiment of the present invention, the second wafer transfer robot takes two wafers 1302 from either of the two second tanks 1060. The two nozzle devices 1503 are turned on for spraying liquid 1900 on the two wafers 1302 from the moment of the two wafers 1302 out of the cleaning liquid in the two second tanks 1060. The second driving mechanism 1076 drives the support seat 1074 to move up to make the support seat 1074 be above the receiving chamber 1071. The window 1077 is closed by the door 1078. The second wafer transfer robot transfers the two wafers 1302 to the support seat 1074. The second wafer transfer robot vertically puts the two wafers 1302 on the support seat 1074. The support seat 1074 vertically supports and holds the two wafers 1302. Then the second driving mechanism 1076 drives the support seat 1074 to move down and the two wafers 1302 are vertically held by the wafer holder 1072 of the second turnover device 1070. The second driving mechanism 1076 drives the support seat 1074 to move down continuously to make the support seat 1074 separate from the two wafers 1302. The support seat 1074 can be located on the bottom wall of the receiving chamber 1071. The two nozzle devices 1503 sprays liquid 1900 on the two wafers 1302 from the moment of the two wafers 1302 out of the cleaning liquid in the two second tanks 1060 till the moment of the two wafers 1302 being rotated in the receiving chamber 1071. The liquid in the receiving chamber 1071 can be drained. The two nozzle devices 1503 are turned off to stop spraying liquid on the two wafers 1302 and the first driving mechanism 1073 drives the wafer holder 1072 to rotate from vertical plane to horizontal plane. Therefore, the two wafers 1302 are rotated from vertical plane to horizontal plane along with the wafer holder 1072. Subsequently, the first driving mechanism 1073 drives the two wafers 1302 to rotate from horizontal plane to inclined plane. There is a pause at inclined plane so as to control the thickness of liquid film on the two wafers 1302. The control of inclined angle and pause time can make the liquid film neither too thin to cause particles attaching on the two wafers 1302 nor too thick to cause the liquid on the two wafers 1302 dropping while transferring the two wafers 1302. The longer the pause time is, the thinner the liquid film on the two wafers 1302. Then the first driving mechanism 1073 drives the two wafers 1302 to rotate from inclined plane to horizontal plane. The third driving mechanism 1079 drives the door 1078 to move down to open the window 1077. The process robot 1080 takes the two wafers 1302 out of the receiving chamber 1071 and transfers the two wafers 1302 with a certain thickness of liquid film to two single wafer cleaning modules 1090 for implementing single wafer cleaning and drying processes.

Referring to FIG. 26 to FIG. 30, according to another embodiment of the present invention, the second wafer transfer robot takes one wafer 1302 from either of the two second tanks 1060. One nozzle device 1503 is turned on for spraying liquid 1900 on the one wafer 1302 from the moment of the one wafer 1302 out of the cleaning liquid in the second tank 1060. The second driving mechanism 1076 drives the support seat 1074 to move up to make the support seat 1074 be above the receiving chamber 1071. The second wafer transfer robot transfers the one wafer 1302 to the support seat 1074. The second wafer transfer robot vertically puts the one wafer 1302 on the support seat 1074. The support seat 1074 vertically supports and holds the one wafer 1302. Then the second driving mechanism 1076 drives the support seat 1074 to move down and the one wafer 1302 is vertically held by the wafer holder 1072 of the second turnover device 1070. The second driving mechanism 1076 drives the support seat 1074 to move down continuously to make the support seat 1074 separate from the one wafer 1302. The support seat 1074 can be located on the bottom wall of the receiving chamber 1071. The one nozzle device 1503 has been spraying liquid 1900 on the one wafer 1302 from the moment of the one wafer 1302 out of the cleaning liquid in the second tank 1060 till the one wafer 1302 is vertically held by the wafer holder 1072. The first driving mechanism 1073 drives the one wafer 1302 to rotate from vertical plane to inclined plane and the one nozzle device 1503 continues spraying liquid 1900 on the one wafer 1302. The one nozzle device 1503 can move back and forth above the one wafer 1302 and spray liquid 1900 on the one wafer 1302. The first driving mechanism 1073 drives the one wafer 1302 to rotate from inclined plane to horizontal plane and the one nozzle device 1503 still moves back and forth above the one wafer 1302 and sprays liquid 1900 on the one wafer 1302. The liquid in the receiving chamber 1071 can be drained. The rotation process of the one wafer 1302 from vertical plane to horizontal plane can be a continuous process. The one nozzle device 1503 is turned off to stop spraying liquid on the one wafer 1302 and the third driving mechanism 1079 drives the door 1078 to move down to open the window 1077. The process robot 1080 horizontally takes the one wafer 1302 out of the receiving chamber 1071. Then the process robot 1080 rotates from horizontal plane to inclined plane, so the one wafer 1302 rotates from horizontal plane to inclined plane. There is a pause at inclined plane so as to control the thickness of liquid film on the one wafer 1302. The control of inclined angle and pause time can make the liquid film neither too thin to cause particles attaching on the one wafer 1302 nor too thick to cause the liquid on the one wafer 1302 dropping while transferring the one wafer 1302. The longer the pause time is, the thinner the liquid film on the one wafer 1302. Then the process robot 1080 rotates from inclined plane to horizontal plane, so the one wafer 1302 rotates from inclined plane to horizontal plane. The process robot 1080 transfers the one wafer 1302 with a certain thickness of liquid film thereon to one single wafer cleaning module 1090 for implementing single wafer cleaning and drying processes.

The methods described in FIG. 4 to FIG. 6 can be applied herein to control and keep a certain thickness of liquid film on the one or more wafers 1302 from the moment of the one or more wafers 1302 out of the cleaning liquid in the one or more second tanks 1060 till the one or more wafers 1302 are transferred to the one or more single wafer cleaning module 1090.

Taking one wafer 1302 and one single wafer cleaning module 1090 for example, the single wafer cleaning module 1090 has a chuck. The process robot 1080 puts the wafer 1302 with a certain thickness of liquid film on the chuck. After the wafer 1302 with a certain thickness of liquid film has been put on the chuck, a nozzle sprays liquid such as deionized water on the wafer 1302 before the wafer 1302 is rotated in the single wafer cleaning module 1090 so as to keep a thickness of liquid film on the wafer 1302. Then the chuck is rotated in the single wafer cleaning module 1090 and the wafer 1302 rotates along with the chuck. Chemical solution is applied on the wafer 1302 to clean the wafer 1302 and then deionized water is applied on the wafer 1302. The flow of the deionized water can be adjusted from 1.2-2.3 lpm, preferably 1.8 lpm. The temperature of the deionized water can be set about 25° C. Then dry the wafer 1302. The chemical solution applied on the wafer 1302 can be, such as DHF, SC1, DIO$_3$ solution. The flow of the DHF can be adjusted from 1.2-2.3 lpm, preferably 1.8 lpm. The temperature of the DHF can be set about 25° C. The concentration of the DHF can be adjusted from 1:10 to 1:1000. The flow of the SC1 can be adjusted from 1.2-2.3 lpm, preferably 1.8 lpm. The temperature of the SC1 can be adjusted from 25° C. to 50° C. The concentration of the SC1 ($NH_4OH:H_2O_2$: $H_2O$) can be adjusted from 1:1:5 to 1:2:100. The method of drying the wafer 1302 includes rotating the chuck at the speed of 1900 rpm and $N_2$ is sprayed on the wafer 1302. The flow of the $N_2$ can be adjusted from 3.5-5.5 lpm, preferably 5 lpm. The temperature of the $N_2$ can be set about 25° C.

After the wafer 1302 is dried in the single wafer cleaning module 1090, the process robot 1080 takes the wafer 1302 out of the single wafer cleaning module 1090 and transfers the wafer 1302 to the buffer room 1100. The index robot 1020 takes the wafer 1302 out of the buffer room 1100 and transfers the wafer 1302 to the wafer cassette located at the load port 1010.

In some embodiments, one or more wafers are sprayed liquid thereon from the moment of the one or more wafers out of cleaning chemical in a first tank till the one or more wafers are immersed in cleaning liquid in one or more second tanks. The one or more wafers are sprayed liquid thereon from the moment of the one or more wafers out of the cleaning liquid in the one or more second tanks till the one or more wafers are transferred to one or more single wafer cleaning modules.

In some embodiments, one or more wafers are sprayed liquid thereon from the moment of the one or more wafers out of cleaning chemical in a first tank till the one or more wafers are immersed in cleaning liquid in one or more second tanks. The one or more wafers are taken out of the cleaning liquid in the one or more second tanks and rotated from vertical plane to horizontal plane. Then the one or more wafers are horizontally transferred to one or more single wafer cleaning modules.

In some embodiments, one or more wafers are taken out of cleaning chemical in a first tank and rotated from vertical plane to horizontal plane. Then the one or more wafers are horizontally transferred to one or more second tanks. The one or more wafers are rotated from horizontal plane to vertical plane and put in cleaning liquid in the one or more second tanks. The one or more wafers are sprayed liquid thereon from the moment of the one or more wafers out of the cleaning liquid in the one or more second tanks till the one or more wafers are transferred to one or more single wafer cleaning modules.

In some embodiments, one or more wafers are taken out of cleaning chemical in a first tank and rotated from vertical plane to horizontal plane. Then the one or more wafers are horizontally transferred to one or more second tanks. The one or more wafers are rotated from horizontal plane to vertical plane and put in cleaning liquid in the one or more second tanks. The one or more wafers are taken out of the cleaning liquid in the one or more second tanks and rotated from vertical plane to horizontal plane. Then the one or more wafers are horizontally transferred to one or more single wafer cleaning modules.

In some embodiments, the one or more second tanks can be cancelled. One or more wafers are transferred to at least one tank filled with cleaning solution for implementing batch cleaning process, and then the one or more wafers are taken out of the cleaning solution in the at least one tank and transferred to one or more single wafer cleaning modules for implementing single wafer cleaning and drying processes. The description of FIG. 2, FIG. 5 to FIG. 9 and FIG. 10 to FIG. 30 are applied herein to control and keep a certain thickness of liquid film on the one or more wafers from the moment of the one or more wafers out of the cleaning solution in the at least one tank till the one or more wafers are transferred to the one or more single wafer cleaning modules.

The controller is configured to control the robots, the nozzles and the wafer holder so as to keep a certain thickness of liquid film on the one or more wafers from the moment of the one or more wafers out of the cleaning chemical in the at least one first tank till the one or more wafers are immersed in the cleaning liquid of the one or more second tanks, and/or from the moment of the one or more wafers out of the cleaning liquid in the one or more second tanks till the one or more wafers are transferred to the one or more single wafer cleaning modules.

The foregoing description of the present invention has been presented for purposes of illustration and description. It is not intended to be exhaustive or to limit the invention to the precise form disclosed, and obviously many modifications and variations are possible in light of the above teaching. Such modifications and variations that may be apparent to those skilled in the art are intended to be included within the scope of this invention as defined by the accompanying claims.

What is claimed is:

1. An apparatus for cleaning semiconductor wafers, comprising:
   a plurality of load ports;
   at least one first tank, containing cleaning chemical, configured to implement batch cleaning process;
   one or more second tanks, containing cleaning liquid, configured to implement batch cleaning process;
   one or more single wafer cleaning modules, configured to implement single wafer cleaning and drying processes;
   wherein the plurality of load ports are transversely arranged in an arrangement of load ports, the at least one first tank and the one or more second tanks are lengthways arranged at a first side of the arrangement of load ports, and the one or more single wafer cleaning modules are lengthways arranged at a second side of the arrangement of load ports and opposing the at least one first tank and the one or more second tanks;
   the apparatus further comprising:
   a first turnover device, configured to rotate one or more wafers from horizontal plane to vertical plane so that the one or more wafers can be vertically transferred to the at least one first tank; and
   a second turnover device, configured to rotate the one or more wafers from vertical plane to horizontal plane so that the one or more wafers can be horizontally transferred to the one or more single wafer cleaning modules;
   wherein the second turnover device comprises:
   a receiving chamber,
   a wafer holder, being set in the receiving chamber,
   a first driving mechanism, driving the wafer holder to rotate in the receiving chamber,
   a support bar, an end of the support bar extending to the receiving chamber,
   a support seat, fixed at the end of the support bar,
   a second driving mechanism, driving the support seat to ascend and descend via the support bar,
   a window, defined on the receiving chamber,
   a door, being set in the receiving chamber, and
   a third driving mechanism, driving the door to move up to close the window or move down to open the window.

2. The apparatus of claim 1, further comprising:
   a first wafer transfer robot, configured to take the one or more wafers and transfer the one or more wafers to the at least one first tank and the one or more second tanks;
   a second wafer transfer robot, configured to take a certain number of wafers out of the one or more second tanks every time and transfer the certain number of wafers to the second turnover device;
   a process robot, configured to take the certain number of wafers out of the second turnover device and transfer the certain number of wafers to the one or more single wafer cleaning modules.

3. The apparatus of claim 2, wherein the second wafer transfer robot has a pair of clamp arms, an end of each clamp arm defines a plurality of clamp slots for holding a plurality of wafers.

4. The apparatus of claim 2, further comprising one or more nozzle devices, wherein every nozzle device is long strip shape and has a slit-shaped nozzle, at least one inlet connects to the slit-shaped nozzle for supplying liquid to the slit-shaped nozzle.

5. The apparatus of claim 4, wherein the number of the one or more nozzle devices is matched with the certain number of wafers taken out by the second wafer transfer robot so that one nozzle device is corresponding to one wafer and sprays liquid on the one wafer.

6. The apparatus of claim 4, wherein the one or more nozzle devices is capable of moving back and forth above the one or more wafers and spraying liquid on the one or more wafers while the one or more wafers is held by the second turnover device.

7. The apparatus of claim 2, wherein the process robot is capable of rotating from horizontal plane to inclined plane and to horizontal plane.

8. The apparatus of claim 2, wherein the certain number of wafers that is taken out of the one or more second tanks every time is equal to or less than the number of the one or more single wafer cleaning modules.

9. The apparatus of claim 2, further comprising a cleaning tank for cleaning the first wafer transfer robot while the first wafer transfer robot is idle.

10. The apparatus of claim 2, further comprising:
    at least one wafer cassette located at least one load port of the plurality of load ports,
    a buffer room, wherein the process robot takes the certain number of wafers out of the one or more single wafer cleaning modules and transfers the certain number of wafers to the buffer room, and
    an index robot, wherein the index robot takes the one or more wafers from the at least one wafer cassette and transfers the one or more wafers to the first turnover device, and the index robot takes the certain number of wafers out of the buffer room and transfers the certain number of wafers to the at least one wafer cassette.

11. The apparatus of claim 1, wherein the one or more wafers are transferred to the one or more single wafer cleaning modules and sprayed liquid thereon before the one or more wafers are rotated in the one or more single wafer cleaning modules.

12. The apparatus of claim 1, wherein the cleaning chemical in the at least one first tank is SPM which is a mixture of $H_2SO_4$ and $H_2O_2$, and the temperature of the SPM is 80° C. to 150° C.

13. The apparatus of claim 1, wherein the cleaning chemical in the at least one first tank is SPM which is a mixture of $H_2SO_4$ and $H_2O_2$, and the concentration ratio of $H_2SO_4$ and $H_2O_2$ is 3:1 to 50:1.

14. The apparatus of claim 1, wherein the one or more wafers are rinsed via a quickly dump rinse using the cleaning liquid in the one or more second tanks.

15. The apparatus of claim 14, wherein the cleaning liquid used for quickly dump rinse is deionized water.

16. The apparatus of claim 1, wherein the number of the one or more second tanks is at least two, the cleaning chemical in the at least one first tank is HF solution, the cleaning liquid in at least one second tank is $H_3PO_4$ solution, the cleaning liquid in other second tank is deionized water for quickly dump rinse.

17. The apparatus of claim 16, wherein the temperature of the $H_3PO_4$ solution is 150° C.-200° C.

18. The apparatus of claim 2, further comprising a space formed between the one or more single wafer cleaning modules and the at least one first tank and the one or more second tanks, the process robot being arranged in the space.

19. An apparatus for cleaning semiconductor wafers, comprising:
- at least one tank, containing cleaning solution, configured to implement batch cleaning process;
- one or more single wafer cleaning modules, configured to implement single wafer cleaning and drying processes;
- one or more robots, configured to transfer one or more wafers to the at least one tank and the one or more single wafer cleaning modules;
- a controller, configured to control the one or more robots;
- wherein the controller is configured to keep a certain thickness of liquid film on the one or more wafers from the moment of the one or more wafers are taken out of the cleaning solution in the at least one tank till the one or more wafers are transferred to the one or more single wafer cleaning modules;
- the apparatus further comprising:
- a first turnover device, configured to rotate the one or more wafers from horizontal plane to vertical plane so that the one or more wafers can be vertically transferred to the at least one tank; and
- a second turnover device, configured to rotate the one or more wafers from vertical plane to horizontal plane so that the one or more wafers can be horizontally transferred to the one or more single wafer cleaning modules;
- wherein the second turnover device comprises:
- a receiving chamber,
- a wafer holder, being set in the receiving chamber,
- a first driving mechanism, driving the wafer holder to rotate in the receiving chamber,
- a support bar, an end of the support bar extending to the receiving chamber,
- a support seat, fixed at the end of the support bar,
- a second driving mechanism, driving the support seat to ascend and descend via the support bar,
- a window, defined on the receiving chamber,
- a door, being set in the receiving chamber, and
- a third driving mechanism, driving the door to move up to close the window or move down to open the window.

* * * * *